US011200129B2

(12) United States Patent
Carrington et al.

(10) Patent No.: US 11,200,129 B2
(45) Date of Patent: Dec. 14, 2021

(54) PERFORMANCE EVALUATION FOR AN ELECTRONIC DESIGN UNDER TEST

(71) Applicant: HEWLETT PACKARD ENTERPRISE DEVELOPMENT LP, Houston, TX (US)

(72) Inventors: Daniel P. Carrington, Plano, TX (US); Derek Sherlock, Ft. Collins, CO (US); Timothy Pertuit, Allen, TX (US); Alan Pippin, Ft. Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 183 days.

(21) Appl. No.: 16/284,193

(22) Filed: Feb. 25, 2019

(65) Prior Publication Data

US 2020/0272548 A1    Aug. 27, 2020

(51) Int. Cl.
*G06F 11/00* (2006.01)
*G06F 11/27* (2006.01)
*G06F 11/30* (2006.01)
*G06F 11/34* (2006.01)

(52) U.S. Cl.
CPC .......... *G06F 11/27* (2013.01); *G06F 11/3024* (2013.01); *G06F 11/3409* (2013.01)

(58) Field of Classification Search
CPC .................. G06F 11/3428; G06F 11/3409
See application file for complete search history.

(56) References Cited

U.S. PATENT DOCUMENTS

| 7,079,010 | B2 | 7/2006 | Champlin |
| 8,879,584 | B2 | 11/2014 | Babbar et al. |
| 9,292,631 | B1 | 3/2016 | Koh et al. |
| 9,958,917 | B1 * | 5/2018 | Hung .................. G06F 11/3037 |
| 2015/0051872 | A1 * | 2/2015 | Arora .................. G06F 11/3428 |
| | | | 702/186 |
| 2018/0062970 | A1 * | 3/2018 | Abzakh ............... G06F 11/3006 |

OTHER PUBLICATIONS

Alam, M. et al.; "AutoPerf: A Generalized Learning System for Root Cause Analysis of Software Performance Regressions"; Nov. 29, 2018; 15 pages.
Colombo, C. et al.; "polyLarva: Technology Agnostic Runtime Verification"; 2013; 14 pages.
Szárnyas, G. et al.; "the Train Benchmark: Cross-technology Performance Evaluation of Continuous Model Queries"; Jan. 17, 2017; 63 pages.

* cited by examiner

*Primary Examiner* — Charles Ehne
(74) *Attorney, Agent, or Firm* — Hewlett Packard Enterprise Patent Department

(57) ABSTRACT

A method for evaluating an electronic design under test may be performed in an environment that includes a functional verification test bench having at least one verification component coupled to the electronic design under test. The method includes provisioning the functional verification test bench to provide protocol-agnostic performance data for activity of the electronic design under test during functional verification testing of the electronic design under test. The method further includes capturing at least a part of the protocol-agnostic performance data from the at least one verification component, and calculating, from the protocol-agnostic performance data, a performance measurement for the electronic design under test.

10 Claims, 14 Drawing Sheets

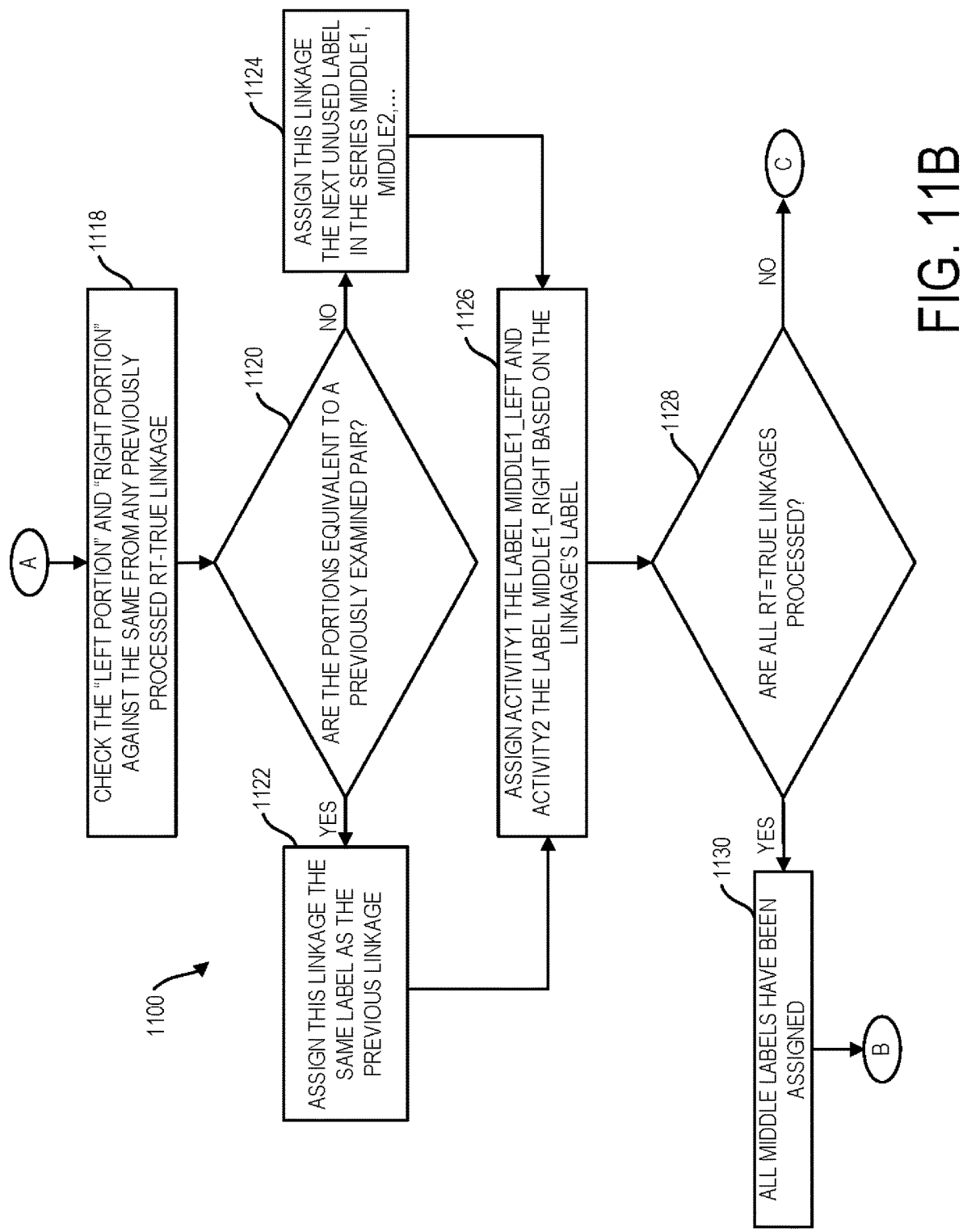

PERFORMANCE EVALUATION FOR AN ELECTRONIC DESIGN UNDER TEST

BACKGROUND

While developing a design for an electronic device, functional verification testing of the electronic design is performed, which simulates and verifies functionality of the electronic device in software using a computing device. During functional verification testing, a functional verification test bench generates and applies stimuli to an electronic design under test. Responses by the electronic design under test to the stimuli are monitored and evaluated by the functional verification test bench against functional expectations for the particular electronic design under test. For example, for an electronic design that is expected to transmit, receive, and process memory requests, the functional verification test bench can generate stimuli and check the responses of the electronic design under test to determine whether it meets the functional expectations of transmitting, receiving, and processing memory requests. Of additional benefit in electronic design development is measuring the performance of the electronic design under test based on its responses during functional verification testing.

BRIEF DESCRIPTION OF THE DRAWINGS

Features of the present disclosure are illustrated by way of example and not limited in the following figures, in which like numerals indicate like elements, in which:

FIG. 10, depict a method for calculating, from captured protocol-agnostic performance data, latency performance measurements, according to one or more examples of the present disclosure; and FIGS. 11A, 11B, and 11C, collectively FIG. 11, depict a method for finding pairs of points of interest to facilitate calculating, from captured protocol-agnostic performance data, latency performance measurements, according to one or more examples of the present disclosure.

DETAILED DESCRIPTION

Figure 1:
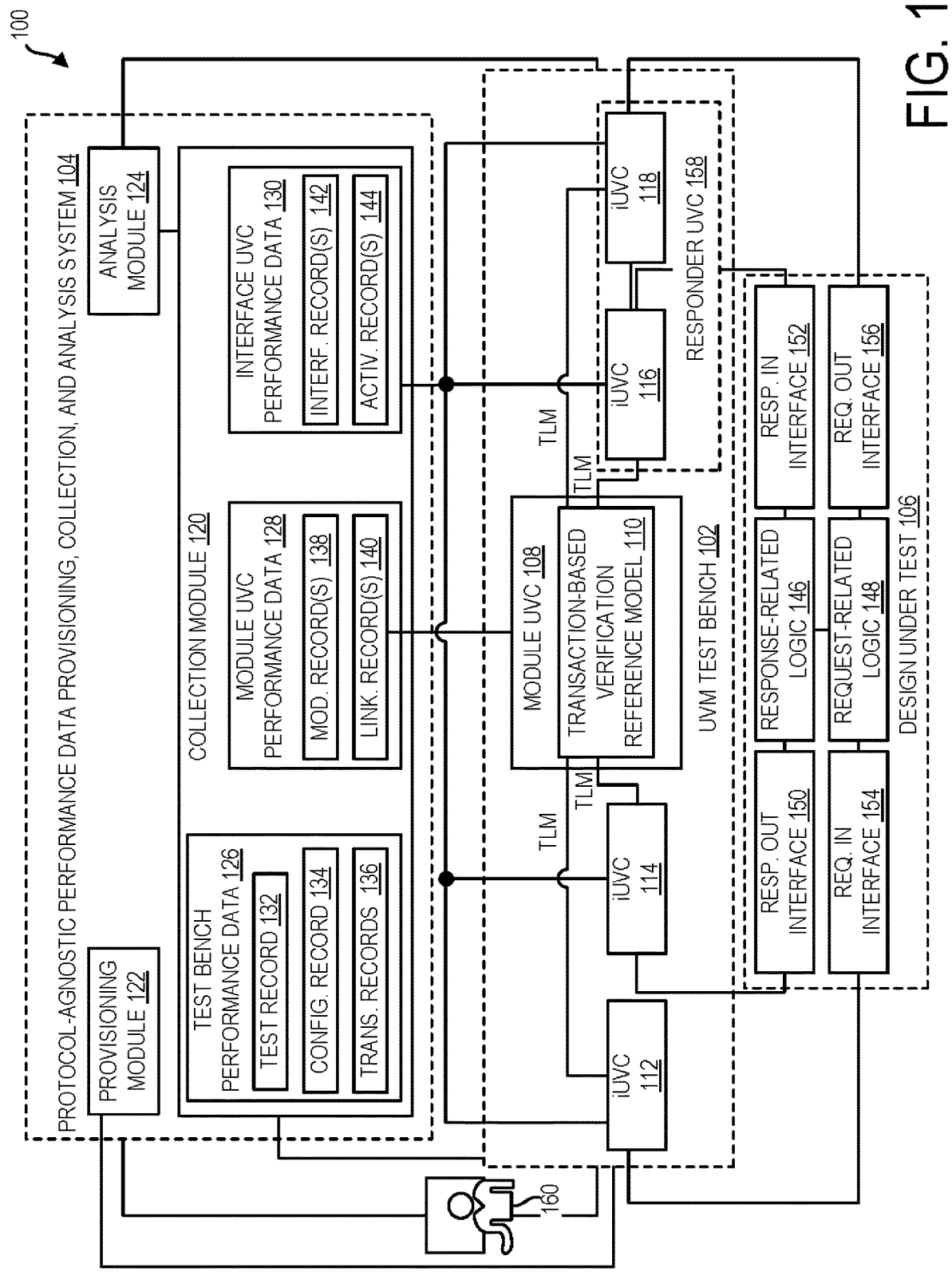
FIG. 1 depicts a functional verification testing and performance evaluation environment that includes a protocol-agnostic performance data provisioning, collection, and analysis system, according to one or more examples of the present disclosure.

Disclosed herein are methods and systems for at least partially evaluating the performance of an electronic design under test. For example, a functional verification testing and performance evaluation environment can include a protocol-agnostic performance data provisioning, collection, and analysis system that can perform one or more methods for evaluating a performance of an electronic design under test, in accordance with the present disclosure. The functional verification testing and performance evaluation environment can further include a functional verification test bench that can perform functional verification testing of an electronic design. The functional verification test bench can include at least one verification component coupled to the electronic design under test. In a particular example, the functional verification test bench is designed in accordance with the standardized Universal Verification Methodology (UVM), e.g., UVM v. 1.0 or any updates thereafter, and, thereby includes, at least one module-specific Universal Verification Component (mUVC) or interface-specific UVC (iUVC).

An example method for evaluating performance of an electronic design under test, in accordance with the present disclosure, includes provisioning the functional verification test bench to provide protocol-agnostic performance data for activity of the electronic design under test during functional verification testing of the electronic design under test. The method further includes capturing at least a part of the protocol-agnostic performance data from the at least one verification component and calculating, from the protocol-agnostic performance data, a performance measurement for the electronic design under test.

For example, capturing at least a part of the protocol-agnostic performance data from the at least one interface verification component can enable calculating performance measurements such as bandwidth and utilization. In another example, additionally capturing some of the protocol-agnostic performance data from the module verification component can enable calculating a performance measurement such as latency. As used herein, "protocol-agnostic" means performance data that describes one or more activities occurring over one or more interfaces without regard to semantics of the one or more protocols used to generate and or forward the one or more activities. As further used herein "activity" is a measurable event at an interface, and an operation is a name of the event. Protocol-agnostic calculations are those such that their inputs are only protocol-agnostic performance data. Protocol-agnostic processing includes calculations and decisions using only protocol-agnostic performance data. Protocol-agnostic criterion is a decision that can be made using only protocol-agnostic performance data.

Examples of protocol-agnostic performance data include, but are not limited to, information about: the size of operations, e.g. the number of bits or the number of operations, or a count of something; the timing of operations, activities, or other occurrences, as in the duration of a thing or the time when a thing occurs; relationships between activities, such as the causation of a second activity by a first activities; the names of operations, devices, addresses, locations, where only the name is considered in a way that is devoid of the semantics or meanings of those names; rates or speed of processing, such as in bits per clock cycle, bits per second, and other rational quantities relating to the size of operations and their timing; etc. By contrast, protocol-related data includes, but is not limited to, information about: formats, semantics of operations, legality of sequence, routing, content, addressing, translation, e.g., between technologies, etc.

In general, protocol-agnostic performance data may be independent of the technology or technologies with which an electronic device, for which its design and performance is to be tested, is intended to operate. In one example, protocol-agnostic performance data is data that can be used to determine performance of an electronic design under test irrespective of the intended technology or technologies with which the electronic design is intended to operate.

One or more methods and systems in accordance with the present disclosure can enable pre-silicon performance analysis in order to improve the interoperability, verifiability, and cost of developing an electronic design. Thorough testing of performance as early as possible in the design process can improve performance outcomes and reduce the chance of customer-visible performance issues. Additionally, one or more methods and systems according to the present disclosure may improve performance testing by reducing the time and development costs of doing such testing and by delivering advanced performance analysis features. This may be accomplished, for instance, integrating the present disclosure into a UVM test bench having reusable UVC components, reusability of instrumentation code used to provision the UVM test bench to provide the performance data irrespective of the underlying electronic device protocols being used, leveraging UVM features such as UVM Scoreboard and UVM Monitor to instrument the UVC components to provide the performance data, structuring the performance data to enable easy protocol-agnostic calculations of performance measurements such as utilization, bandwidth, high-level latency, hop latency, buffer utilization, etc. This, in turn, can enable a more efficient and effective use of computing resources and coding resources.

FIG. 1 depicts a functional verification testing and performance evaluation environment 100 (hereinafter the environment 100) that includes a protocol-agnostic performance data provisioning, collection, and analysis system 104 (hereinafter the system 104), according to one or more examples of the present disclosure. The environment 100 further includes a functional verification test bench 102 communicatively coupled to the system 104, for instance through a software coupling or interface. The functional verification test bench 102 includes a module verification component 108 and multiple interface verification components 112, 114, 116, 118 communicatively coupled between the module verification component 108 and an electronic design under test 106 (hereinafter the DuT 106), for instance through a software coupling or interface. A user 160, for example a test engineer, can interact with the environment 100, for example the functional verification test bench 102 and/or the system 104.

In general, the module verification component 108 can verify activity of the DuT 106 during functional verification testing, for example, based on responses of the DuT 106 to stimuli generated by one or more of the interface verification components 112, 114, 116, 118. The interface verification components 112, 114, 116, 118 can also verify activity of the DuT 106 and further monitor and transfer test data generated while the DuT 106 performs activity during the functional verification testing. For example, the test data can include any information transferred between the interface verification components 112, 114, 116, 118 and the DuT 106. Such information may include traffic from the DuT 106 and stimuli provided to the DuT 106 in response to the traffic or to cause the DuT to generate the traffic. The test data can also include any information transferred between the interface verification components 112, 114, 116, 118, such as forwarding between two of the interface verification components 112, 114, 116, 118 information that was received from the DuT 106. The test data can further include any information transferred between the interface verification components 112, 114, 116, 118 and the module verification component 108, such as information used by the module verification component 108 to verify the activity of the DuT 106 against functional expectations.

In the illustrated example, the functional verification test bench 102 is designed or constructed in accordance with a version of the UVM standardized methodology and is therefore termed a UVM test bench 102. Accordingly, the module verification component 108 is an mUVC, which includes a verification reference model 110 programmed to verify the activity of the DuT 106 against functional expectations. Additionally, in this example, the interface verification components 112, 114, 116, and 118 are iUVCs. According to the UVM standard, iUVCs such as 112, 114, 116, and 118 are expected to include an interface, coupling the iUVC to the DuT 106, as well as a verification reference model which relates to verifying the operation of the interface to which the iUVC is coupled, so as to simplify the implementation of any module verification components to which the iUVC is connected by a transaction-level modeling interface. In a particular example, a UVM test bench that includes a single iUVC is expected to include an interface and a verification reference model.

Moreover, in this particular example, the verification reference model 110 is transaction-based and, thereby, includes a transaction-level modeling (TLM) software interface to other verification components, in this case to the iUVCs 112, 114, 116, 118. The TLM software interface enables the mUVC 108 to process abstract transaction objects representing a single unit of activity. Abstract transaction objects are also referred to herein as transactions and are labeled as "TLM" on lines representing communicative coupling between the iUVCs 112, 114, 116, and 118 and the verification reference model 110. Additionally, the use of the TLM software interface enables iUVCs 112, 114, 116, 118 to be reconfigured, compatibly replaced, or changed without affecting the behavior of the mUVC 108. These abstract transaction objects can be produced, for instance, by the iUVCs 112, 114, 116, 118 upon detecting a pattern of activity on what is represented in software as a set of wires of the DuT 106. For example, a single read request or write data transfer can be considered a single transaction.

As illustrated, the DuT 106 includes response-related logic 146, request-related logic 148, and four DuT interfaces 150, 152, 154, 156. The DuT interfaces include a response output interface 150, a response input interface 152, a request input interface 154, and a request output interface 156. The response-related logic 146 and request-related logic 148 are communicatively coupled to each other. The response output interface 150 is communicatively coupled between the response-related logic 146 and the iUVC 114. The response input interface 152 is communicatively coupled between the response-related logic 146 and the iUVC 116. The request input interface 154 is communicatively coupled between the request-related logic 148 and the iUVC 112. The request output interface 156 is communicatively coupled between the request-related logic 148 and the iUVC 118. In one example, the communicative coupling within the DuT 106 and between components of the DuT 106 and components of the UVM test bench 102 can be effected using a software coupling or interface.

In the illustrated example, the DuT 106 represents a software-implemented design for an electronic device that transmits, receives, and processes requests and responses such as memory requests and responses. For example, computer peripherals, accelerators, expansion cards, and storage devices may be available to a computer operating system as memory-mapped devices. General-purpose accesses to these types of devices, as well as to main memory, can be performed using memory read and write operations and storage block accesses. For instance, any of these devices may receive a request to do a Read operation, which according to the protocol implemented by the memory system, may cause the memory device to send a response carrying the data contained in the memory corresponding to the request.

In this example, the DuT 106 may represent an electronic device that would receive a memory request from another electronic component, forward the memory request to the appropriate memory device such as one listed above, receive the corresponding memory response, and then forward that memory response to the component that originated the memory request. Accordingly, to verify the functionality of the DuT 106, the UVM test bench 102 can be constructed to simulate both the electronic device sending the memory request and the memory device providing the memory response and then verify whether the DuT 106 correctly processes this memory traffic.

In a particular example, during functional verification testing of the DuT 106, the iUVC 112 can generate and identify a memory request (e.g., MemoryRequest1) to do a Read operation. The iUVC 112 forwards the MemoryRequest1 to the request input interface 154 of the DuT 106 and identifies the MemoryRequest1 to the verification reference model 110 as a transaction. If the DuT 106 functions as designed, the request-related logic 148 receives the MemoryRequest1 from the request input interface 154 and forwards a MemoryRequest2 that is identical to MemoryRequest1, derived from MemoryRequest1, or adapted to a different technology than MemoryRequest1, to the iUVC 118 through the request output interface 156. The iUVC 118 identifies the MemoryRequest2 to the verification reference model 110 as a transaction. Upon receiving both the MemoryRequest1 transaction and the MemoryRequest2 transaction from both the iUVC 112 and the iUVC 118, the verification reference model 110 can verify that that DuT 106 functioned as expected to receive and forward a memory request.

The iUVC 118 also forwards the MemoryRequest2 to the iUVC 116, to which it is communicatively coupled, for instance through a software coupling or interface. The iUVC 116 can generate an appropriate memory response for MemoryRequest2 (e.g., MemoryResponse1) to, for instance, simulate retrieving data responsive to the MemoryRequest2. The iUVC 116 forwards the MemoryResponse1 to the response input interface 152 of the DuT 106 and identifies the MemoryResponse1 to the verification reference model 110 as a transaction that is related to, in this case generated in response to or caused by, the MemoryRequest2. If the DuT 106 functions as designed, the response-related logic 146 receives the MemoryResponse1 from the response input interface 152 and forwards a MemoryResponse2 that is identical to MemoryResponse1, derived from MemoryResponse1, or adapted to a different technology than MemoryResponse1, to the iUVC 114 through the response output interface 150. The iUVC 114 identifies the MemoryResponse2 to the verification reference model 110 as a transaction. Upon receiving both the MemoryResponse1 transaction and the MemoryResponse2 transaction from both the iUVC 114 and the iUVC 116, the verification reference model 110 can verify that that DuT 106 functioned as expected to receive and forward a memory response.

Accordingly, in order to perform appropriate testing of this example DuT 106, the iUVC 116 coupled to the response input interface 152 of the DuT 106 is informed of the details of requests output by the DuT 106 and uses this information to generate appropriate test stimulus for the response input interface 152. For the illustrated example, where the DuT 106 forwards Read requests to another component, the iUVCs 118 and 116 coupled, respectively, to the request output interface 156 and the response input Interface 152 may cooperate to emulate behavior appropriate for the component or components connected to the response input interface 152 and the request output 156. Thus, in a UVM test bench, such as the UVM test bench 102, the iUVCs 116 and 118 can be placed inside of a reusable Responder UVC 158 that configures the iUVCs 116, 118 for operation with each other.

In accordance with one or more examples of the present disclosure, the system 104 may be used in the environment 100 to measure the performance of the DuT 106 while performing activities during functional verification testing such as receiving and forwarding memory requests and responses. However, in other examples, the UVM test bench 102 may be constructed to perform functional verification testing of a DuT 106 that processes other types of request and response traffic or a DuT 106 that performs other types of activities. In such a case, the system 104 may be used in the environment 100 to measure the performance of the DuT 106 while performing these other types of activities during functional verification testing.

As illustrated, the system 104 includes a collection module 120, a provisioning module 122, and an analysis module 124. The provisioning module 122 can prepare the UVM test bench 102 to capture protocol-agnostic performance data, also referred to herein as performance data, some of which may be used to calculate performance measurements for the DuT 106 activity. The collection module 120 captures the performance data, and the analysis module 124 can calculate one or more performance measurements and can further store results of these calculations and/or present the results of these calculations to the user 160. The protocol-agnostic performance data may include the data actually used in one or more algorithms to calculate one or more performance measurements. The protocol-agnostic performance data may also include metadata that describe or identify features of the UVM test bench 102 and components therein and/or features of the DuT 106.

The illustrated collection module 120 can capture different types of protocol-agnostic performance data from the UVM test bench 102. For example, the collection module can capture interface UVC performance data 130 from one or more of the iUVCs 112, 114, 116, 118, module UVC performance data 128 from the mUVC 108, and/or test bench performance data 126 from the UVM test bench 102. The particular protocol-agnostic performance data captured can depend, at least in part, on the one or more performance measurements to be calculated. In the described examples, the iUVC performance data 130 includes one or more interface records 142 and activity records 144. The mUVC performance data 128 may include one or more module records 138 and linkage records 140. The test bench performance data 126 may include one or more test records 132, configuration records 134, and transaction records 136.

Figure 2:
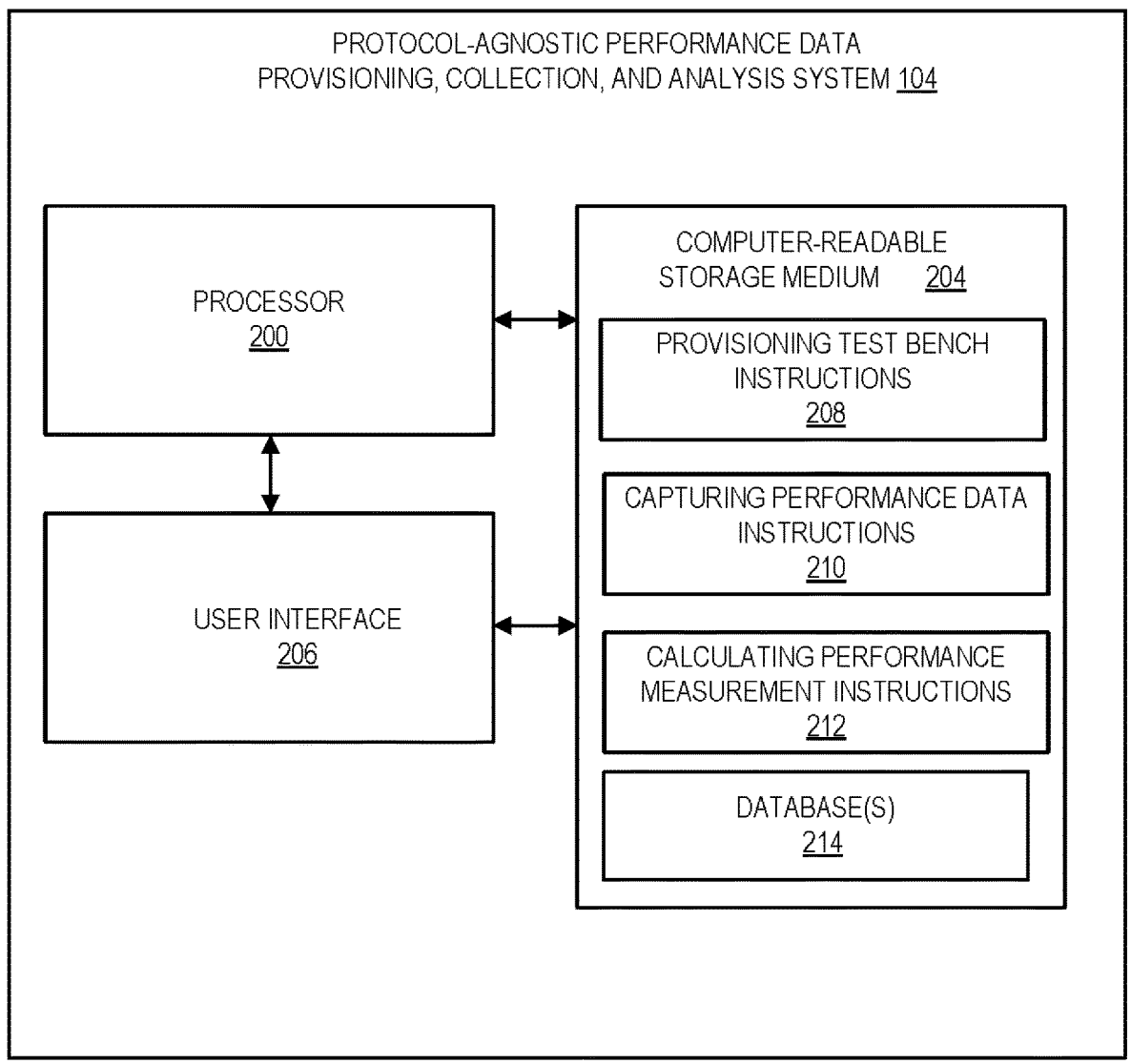
FIG. 2 further illustrates the protocol-agnostic performance data provisioning, collection, and analysis system depicted in FIG. 1, according to one or more examples of the present disclosure.

FIG. 2 further illustrates the system 104 depicted in FIG. 1, according to one or more examples of the present disclosure. The system 104 can be implemented using any suitable computing device that includes a hardware processor 200, a non-transitory computer-readable storage medium 204, and one or more user interfaces 206 operatively coupled together to carry out the functionality of the system 104. As used herein a "module" may represent hardware such as a processor or computer-readable storage medium and/or may represent particular functionality that is realized by the processor executing instructions stored in the computer-readable storage medium. The system 104 can be implemented on the same or a difference computing device from one used to implement the UVM test bench 102 and the DuT 106.

As illustrated, the computer-readable storage medium 204 can include provisioning test bench instructions 208, capturing performance data instructions 210, and calculating performance measurement instructions 212. The instructions 208, 210, 212 when executed by the processor 200 can cause the processor 200 to operate the provisioning module 122, the collection module 120, and the analysis module 124 to perform one or more methods for evaluating performance of the DuT 106, for example one or more methods illustrated and described below with respect to FIGS. 5, 8, 9, 10, and 11 in accordance with the present disclosure. The computer-readable storage medium 204 can further include databases 214 that may be used, for instance, to store captured protocol-agnostic performance data and calculated performance measurements. A user, for instance the user 160, can interact with the user interface 206, for example through one or more input and output devices, to provision the UVM test bench 102 using the provisioning module 122 and to view or adjust calculated performance measures stored and/or presented by the provisioning module 122.

In one example, the processor 200 contains one or more hardware processors, where each hardware processor may have a single or multiple processor cores. Examples of processors include but are not limited to a central processing unit (CPU) and a microprocessor. Although not illustrated in FIG. 2, the processing elements that make up processor 200 may also include one or more of other types of hardware processing components, such as graphics processing units (GPU), application specific integrated circuits (ASICs), field-programmable gate arrays (FPGAs), and/or digital signal processors (DSPs).

A machine-readable storage medium, such as 204 of FIG. 2, may include both volatile and nonvolatile, removable and non-removable media, and may be any electronic, magnetic, optical, or other physical storage device that contains or stores executable instructions, data structures, program modules, or other data accessible to a processor, for example firmware, erasable programmable read-only memory (EPROM), random access memory (RAM), non-volatile random access memory (NVRAM), optical disk, solid state drive (SSD), flash memory chips, and the like. The machine-readable storage medium may be a non-transitory storage medium, where the term "non-transitory" does not encompass transitory propagating signals. The user interface 206 can include a display, positional input device (such as a mouse, touchpad, touchscreen, or the like), keyboard, or other forms of user input and output devices communicatively coupled to processor the 200 and/or the computer-readable storage medium 204.

Figure 3:
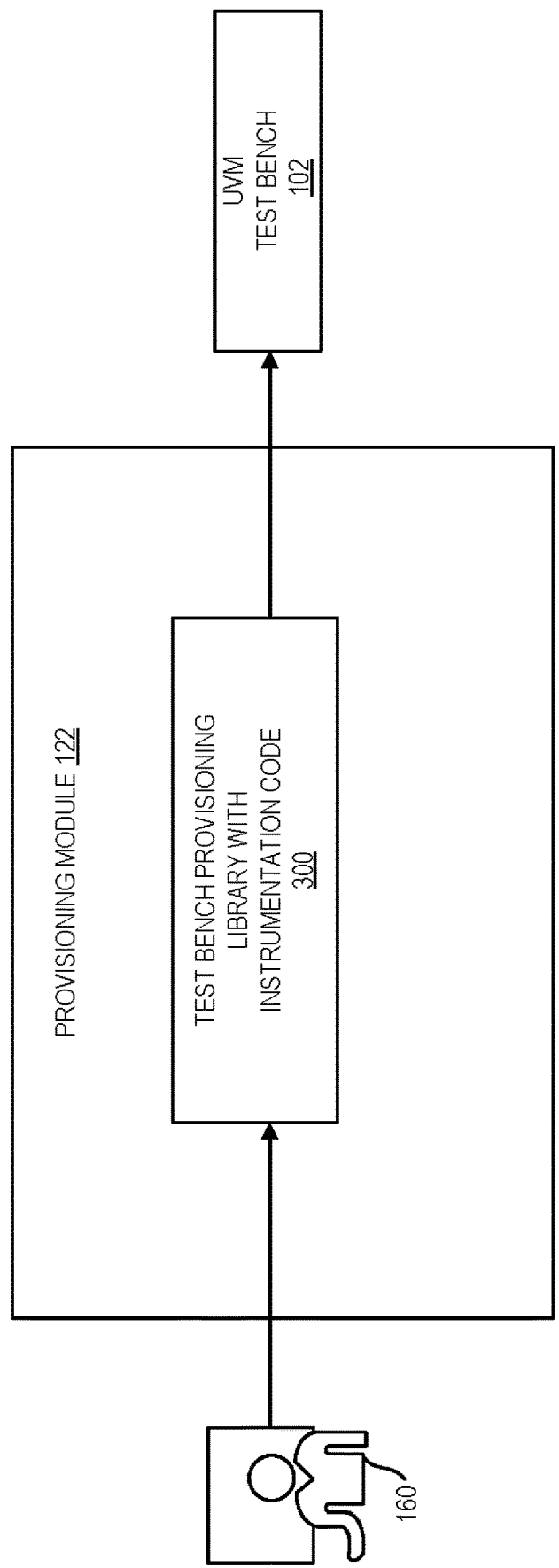
FIG. 3 further illustrates a provisioning module of the protocol-agnostic performance data provisioning, collection, and analysis system depicted in FIG. 1, according to one or more examples of the present disclosure.

FIG. 3 further illustrates the provisioning module 122 of the system 104 depicted in FIG. 1, according to one or more examples of the present disclosure. In the example, the provisioning module 122 includes a test bench provisioning library 300. In a particular example, the test bench provisioning library 300 includes at least instrumentation code to instrument the UVM test bench 102. The user 160 may control the provisioning module 122 to instrument the UVM test bench 102, for instance, by adding instrumentation code to one or more of the iUVCs 112, 114, 116, 118 and/or the mUVC 108. The instrumentation code, thereby, instruments these components to provide the protocol-agnostic performance data, for instance the iUVC performance data 130 and the mUVC performance data 126. The user 160 may also, in another example, control the provisioning module 122 to otherwise configure the UVM test bench 102 to provide the test bench performance data 126.

Figure 4:
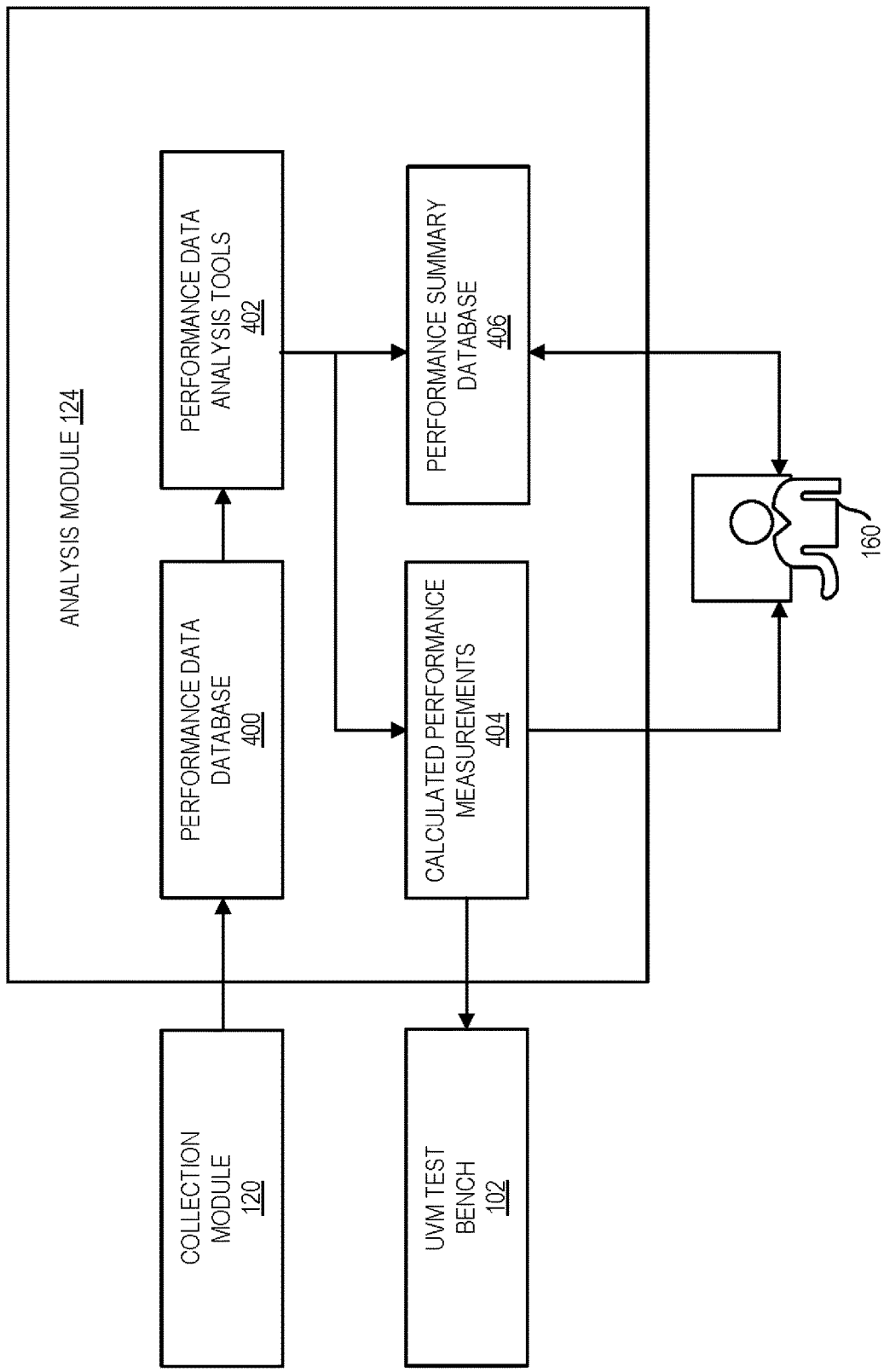
FIG. 4 further illustrates an analysis module of the protocol-agnostic performance data provisioning, collection, and analysis system depicted in FIG. 1, according to one or more examples of the present disclosure.

FIG. 4 further illustrates the analysis module 124 of the system 104 depicted in FIG. 1, according to one or more examples of the present disclosure. The illustrated analysis module 124 represents a performance data database 400, performance data analysis tools 402, one or more calculated performance measurements 404, and a performance summary database 406. In an example, the performance data database 400 and the performance summary database 406 are implemented as one of the databases 214 shown in FIG. 2 of the computing device which implements the system 104.

FIG. 4 further illustrates a logical flow between the collection module 120, the blocks 400, 402, 404, and 406 which represent the analysis module 124, and the user 102. In an example, the performance data database 400 stores performance data captured by the collection module 120 during functional verification testing. For instance, the performance data database 400 stores the iUVC performance data 130, the mUVC performance data 128, and the test bench performance data 126. The performance data analysis tools 402 process the performance data to calculate one or more performance measurements 404 which may be interfaced in whole or part to the UVM test bench 102, presented to the user 160, and/or or stored in the performance summary database 406. The user 160 may access the performance summary database 406 to view the contents contained therein in various formats.

Figure 5:
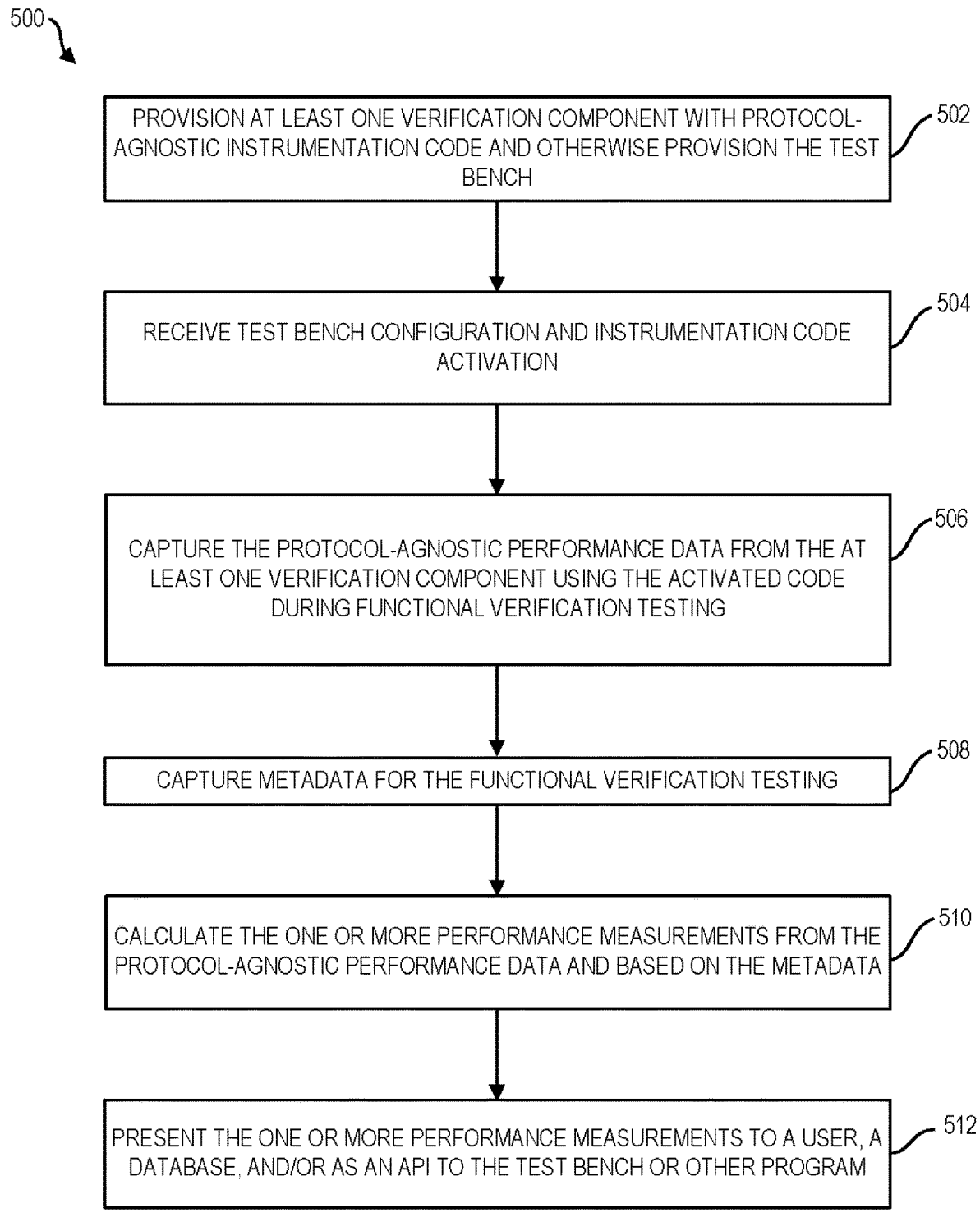
FIG. 5 depicts a method for evaluating performance of an electronic design under test, according to one or more examples of the present disclosure.

Referring now to FIG. 5, which depicts a method 500 for evaluating performance of an electronic design under test, according to one or more examples of the present disclosure. In an example, the method 500 is performed using the performance analysis tools 402 of the analysis module 124. In accordance with the example method 500, prior to the functional verification testing, the UVM test bench 102 is provisioned (502), for instance using instrumentation code from the test bench provisioning library 300. In an example, instrumentation code can be added (502) to one or more of the iUVCs 112, 114, 116, 118 and to the mUVC 108 in order for these components to provide the performance data for analyzing the performance of the DuT 106. Any suitable software code can be used for the instrumentation code, such as JavaScript Object Notation (JSON). In an example, the instrumentation code is compatible with verification language or code used to operate the UVM test bench 102 and the iUVCs 112, 114, 116, 118 and mUVC 108 therein. Additionally, language-specific features to the verification language in use by the UVM test bench 102 may be used in order to enable, activate, or launch (504) the instrumentation code therein when performance measurements are to proceed after the functional verification testing.

In another example, the instrumentation code may leverage features of the methodology used to construct the UVM test bench 102 and its components mUVC 108 and iUVCs 112, 114, 116, and 118. This enables greater protocol-agnostic integration of the system 104 and the UVM test bench 102 to facilitate performance analysis. For instance, a test bench constructed in accordance with UVM can be equipped with features for monitoring, diagnosing errors, and writing trace information or metadata with respect to the functional verification testing, the test bench and the modules therein, the traffic and transactions, causation between transactions, etc. One example feature is a "UVM Scoreboard" which can be used as a source of information about causality between events for an electronic design under test. Another example feature is "UVM Monitor" which can be used as a source of information about hardware interfaces, their parameterizations, and their maximum bandwidth. UVM configuration can be used to enable the UVM Scoreboard and UVM Monitor functionality.

In a particular example, the implementation and use of the instrumentation code does not affect the reusability of the iUVC 112, 114, 116, 118 and mUVC 108 code in multiple verification contexts. The instrumentation code itself is reusable as well. Accordingly, when the system 104 is used with TLM, this can permit the reuse of instrumentation code when performance-affecting hardware parameterization is in use. It may also permit the use of compatible replacement iUVCs in conjunction with a mUVC provisioned with the instrumentation code. Accordingly, an advantage of integrating systems and methods of performance evaluation according to the present disclosure with UVM in electronic design development is leveraging the reusability of the UVCs to test multiple electronic designs.

This reuse involves a degree of separation of concerns between different UVCs so that UVCs can be used together or separately as needed for a particular design verification task across multiple electronic designs. For example, when an electronic interface is reused or leveraged for similar functionality in different electronic designs, a corresponding iUVC can be reused or leveraged from one electronic design to another for verifying that similar functionality. Similarly, when a piece of hardware is reused or leveraged for similar functionality in different electronic designs, an mUVC can be reused or leveraged from one electronic design to another for verifying that similar functionality. Additionally, groups of UVCs assembled in a particular configuration or for a particular design verification task, such as the Responder UVC 158, can be encapsulated in a UVM environment for later reuse. Moreover, hardware designs are often parameterized to permit the same design to be used in multiple applications. For example, an interface could be specified as a x1, x2, x4, x8, or x16 multiple of some base width, permitting the use of a wider interface to increase performance or a narrower interface to save space or reduce cost. Thus, an iUVC can correspondingly be configured to operate on any of those hardware configurations of the same interface.

In another example, the mUVC 108 and the iUVCs 112, 114, 116, 118 can be provisioned with the instrumentation code by integrating these components with the test bench provisioning library 300. Namely, the test bench provisioning library 300 provides a domain-specific interface between a functional verification environment, such as the UVM test bench 102, and a performance data recording interface, such as the collection module 120 of the system 104, by producing an appropriate performance data log that can be processed by analysis tools, such as the performance data analysis tools 402, after the conclusion of the functional verification testing.

If the mUVC 108 and the iUVCs 112, 114, 116, 118 of the UVM test bench 102 are already provisioned with the instrumentation code for providing the protocol-agnostic performance data for the desired performance measurement, the code can be reused. This can occur, for example, when the mUVC 108 and the iUVCs 112, 114, 116, 118 were previously used to perform functional verification testing for a DuT other than the DuT 106. Otherwise, the mUVC 108 and the iUVCs 112, 114, 116, 118 can be selectively provisioned (502) with the instrumentation code based on the performances measurements to be calculated. For example, if bandwidth or utilization measurements are desired, then one or more of the iUVCs 112, 114, 116, 118 are provisioned with the instrumentation code. However, in another example, if latency measurements are desired, then the mUVC 108 and Responder UVC 158 are also provisioned with the appropriate instrumentation code.

Turning again to the method 500, with the instrumentation code in place associated with the performance measurements to be calculated, the UVM test bench 102 may receive a configuration (504) and the appropriate mUVC 108 and iUVCs 112, 114, 116, 118 may be activated (504). In one example, the user 160 configures the UVM test bench 102 to specify or identify the mUVC 108 and iUVCs 112, 114, 116, 118 to provide the performance data. In another example, the user 160 activates, via verification-language-specific means for instance, the instrumentation code for the mUVC 108 and/or 112, 114, 116, 118 to be loaded and used in the functional verification testing. In a particular example, the user 160 allocates a name for each iUVC 112, 114, 116, 118 that provides the performance data used in calculating utilization, bandwidth, and or latency measurements. Naming the iUVCs 112, 114, 116, 118 can serve as metadata to aid in interpreting the performance measurement results.

The test bench provisioning library 300 may provide facilities to iUVCs 112, 114, 116, 118 that support defining parameterized hardware interfaces, such as those represented by the DuT interfaces 150, 152, 154, 156. The instrumented iUVC 112, 114, 116, 118 can use its configuration to provide protocol-agnostic performance data within one or more interface records 142 including, but not limited to, information about width of the DuT interface 150, 152, 154, 156, clock speed, overall data rate, the interface technology, and the name of the DuT interface 150, 152, 154, 154. In another example, when the UVM test bench 102 has instrumentation code activated, the instrumentation code can read working configuration information resulting in accurate information about the DuT 106 capability. The UVM test bench 102 may provide the working configuration information in one or more configuration records 134.

In another example, the instrumented iUVCs 112, 114, 116, 118 can report the fact of memory traffic through the DuT interface 150, 152, 154, 156 being monitored, resulting in one or more activity records 144 containing relative time and quantity of overhead or application data transferred by that part of the DuT 106. In another example, the instrumented iUVCs 112, 114, 116, 118 can report the fact of a piece of memory traffic as being an independent item sent as part of the functional verification testing. Additionally, the instrumented iUVCs 112, 114, 116, 118 can produce a transaction object for inspection and checking by the mUVC 108 that uniquely identifies the previous fact of memory traffic through a DuT interface 150, 152, 154, 156.

The test bench provisioning library 300 may provide facilities to the mUVC 108 and/or the Responder UVC 158, which support transaction-level modeling of complex performance functionality. The instrumented Responder UVC 158 or mUVC 108 can report in one or more linkage records 140 a causal relationship between two transaction objects inspected by the Responder UVC 158 or mUVC 108. This allows reporting that one item of memory traffic caused a later item of memory traffic. Because one example UVM Scoreboard implementation is one that matches expected TLM items to actual TLM items, causation reporting is easily implemented by most if not all mUVCs. Other example methods of implementing design verification functionality in the mUVC 106 are "predict and match" and "observe and justify". In both examples, an output from the DuT 106 is legal if some previous input(s) to the DuT 106 is/are specified to produce that output. This statement also suffices to establish causality between the inputs and outputs.

In another example, the configured UVM test bench 102 itself can set some global options as may be facilitated by the test bench provisioning library 300. This can, for instance, enable defining performance test cases that can be included in one or more test records 132 and may enable configuring performance analysis options which may be included in one or more configuration records 134. In a particular example, the UVM test bench 102 can set the name of the test and create typed parameters whose name and value are attached to the test as metadata. The parameters may be Boolean, integer, numeric, or string in data type. In further examples, the configured UVM test bench 102 can provide a configuration record 134 containing performance analysis options that may, for instance, set test-specific performance analysis options to select a performance measurement mode such as bandwidth-only, bandwidth-and-latency, etc. During running of the functional verification testing of the DuT 106, the instrumentation code and other provisioning and configuration causes the UVM test bench 102 to provide the protocol-agnostic performance data. The performance data including any metadata is captured (506, 508) by the collection module 120.

As previously referenced, the protocol-agnostic performance data including metadata can contain various types of information that can aid in calculating one or more performance measurements. This performance data can include, for example, data about the functional verification testing or about specific DuT 106 activity and what interfaces of the DuT 106 are being modeled and stimulated during the functional verification testing. The protocol-agnostic performance data including metadata may also include data about logical relationships between the DuT 106 activities and about the protocols used by the DuT 106 when the DuT 106 is operating in the scenario being tested. This captured performance data may be stored in one or more databases, such as in the performance data database 400, for use by the performance data analysis tools 402 to calculate the one or more performance measures.

In a particular example, accurate performance measurements using one or more methods according to the present disclosure can be implied by a correctly configured functional verification testing environment, e.g., a correctly configured and instrumented UVM test bench 102. The performance measurements may, in one example, be computed by an algorithm that can automatically identify what performance measurements can be calculated from the available performance data including any metadata and then make the calculations. In another example, the algorithm can also assign each performance measurement a unique identifier based on the metadata associated with each measurement. In these examples, the process of provisioning the correctly configured functional verification testing environment to the testbench (502) is used to assure the calculation of accurate and complete performance measurements (510) that correctly reflect the parameterization and operation of the DuT are produced by the analysis module 124.

Figure 6:
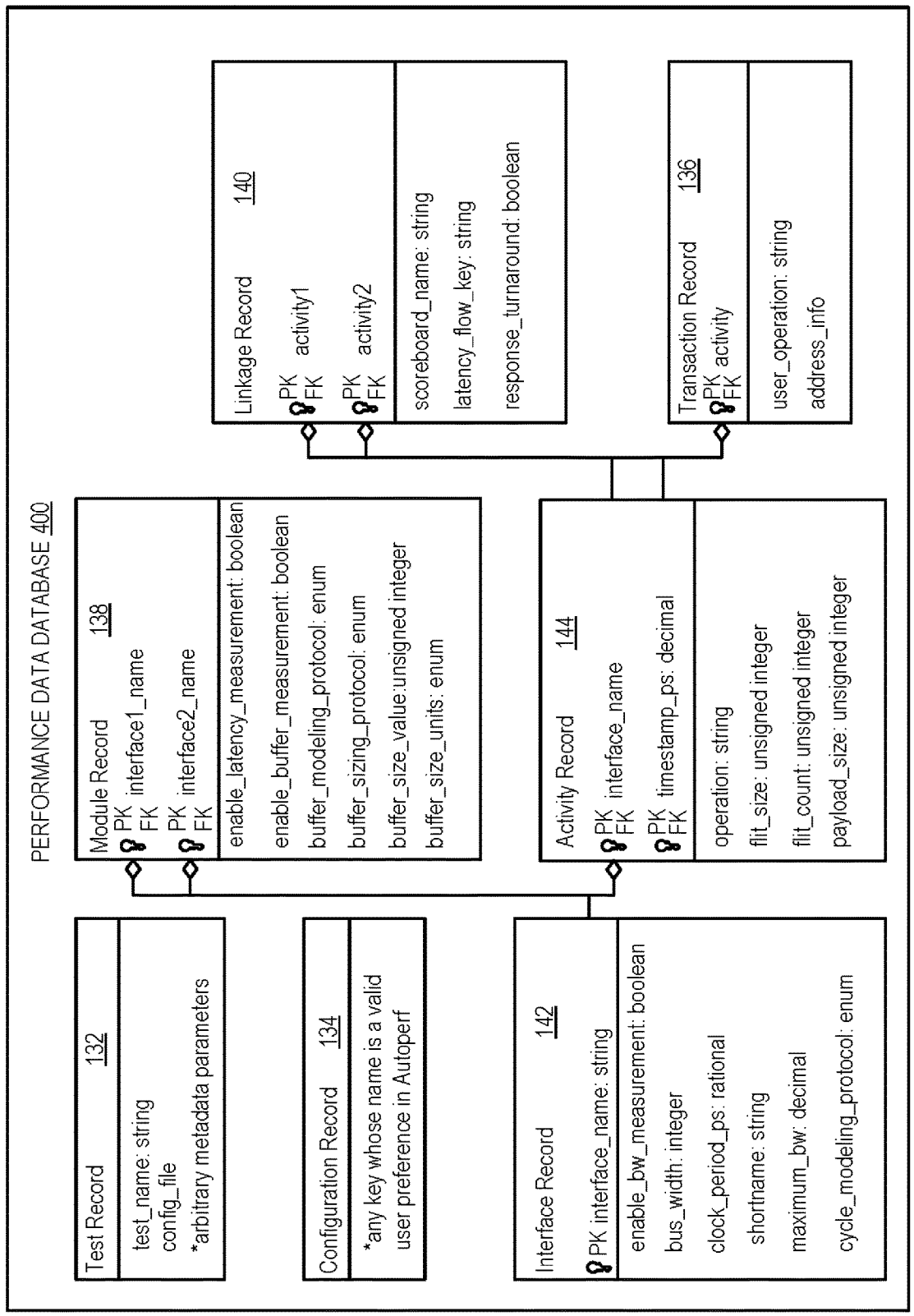
FIG. 6 depicts a performance data database into which captured protocol-agnostic performance data can be stored, according to one or more examples of the present disclosure.

Referring now to FIG. 6 with continued reference to FIG. 5, FIG. 6 further illustrates the performance data database 400 of the analysis module 124 depicted in FIG. 4, into which captured protocol-agnostic performance data can be stored, according to one or more examples of the present disclosure. In particular, FIG. 6 illustrates an example arrangement and content of a test record 132, a configuration record 134, a transaction record 136, a module record 138, a linkage record 140, an interface record 142, and an activity record 144. FIG. 6 further illustrates example performance data, metadata per record, test bench configuration data related to the functional verification testing, and configuration metadata related to the performance measurements. Although, for ease of illustration, there is shown one of each record type corresponding to one functional verification testing scenario for the DuT 106, the performance data database 400 can contain multiple of each record type across multiple functional verification testing and multiple DuTs.

To enable using protocol-agnostic performance data to calculate the performance measurements, the records may be arranged as a "tree" of hierarchical records where records higher in the tree reference facts about the environment 100 and about details of things that have occurred during the functional verification testing. Whereas, records lower in the hierarchy add additional information about a higher record or develop relationships between the records. In this example, "PK" represents primary key. The combination of all of the primary key rows inside of a record definition states what needs to be unique among all of the records of that type. In an example, there is one linkage between a pair of activities. Additionally, in this example, there is one transaction record for an activity, if there is one at all, and one activity record occurs at a particular time on a particular interface. Additionally, "FK" represents a foreign key relationship, which means that something on the other side of this record has the same value for that row. For instance, activity1 in the linkage record 140 means that this is referring to a specific activity record with a particular interface name and timestamp, for instance in picoseconds.

In this example, the test record 132 and the configuration record 134 describe what the test scenario is and how to measure it. In a particular example, the user 160 can supply metadata keys and values which describe the test and is captured in the test record 132. For instance, the test record 132 can indicate whether or not the test exists for the purpose of measuring latency, using a config_file data element. The test record 132 may further indicate a name of a workload that is being used to stimulate the DuT 106, using a test_name:string data element. The configuration record 134 lets the functional verification test supply options to the performance data analysis tools 402 including user preferences for the performance measurement calculations.

The interface record 142 has captured therein at least a part of the protocol-agnostic performance data from the at least one verification reference model interfaces 112, 114, 116, 118. In general, the interface record 142 can indicate that there is a DuT 106, which has this interface identified by an interface_name: string data element, with the named interface having properties identified in the interface record 142. Moreover, in this example, the interface record 142 can indicate configuration data related to the performance measurement to be made for the named interface. As illustrated, the interface record contains an enable_bw_nneasurenennt: Boolean data element, which controls whether or not bandwidth and utilization measurement should be on this interface. The remaining illustrated data elements contain a mixture of performance data items used for calculating bandwidth and utilization and metadata used for presenting the results of the calculations. For instance, data elements bus_width: integer, clock_period_ps: rational, and cycle_modeling_protocol: enum can be used for the bandwidth and utilization calculations. Whereas, data elements shortname: string and maximum_bw: decimal can be used to present to the user 160 the results of those calculations.

In this example, the module record 138 identifies two related interfaces using data elements interface1_name and interface2_name and indicates the performance measurements enabled, using data elements enable_latency_measurement: boolean and enable_buffer_measurement: boolean. The remaining data elements buffer_modeling_protocol: enum, buffer_sizing_protocol: enum, buffer_size_value: unsigned integer, and buffer_size_units: enum represent captured performance data that can be used for one or more buffer performance measurement calculations. In a particular example, this performance data may be used to calculate whether or not a buffer inside of the DuT 106 is full. For instance, memory units inside of the DuT 106 can be divided into the least usable portion and then as activities go into the DuT 106 a calculation of the amount of memory buffer used can be made. Similarly, as the activities leave the DuT 106, an amount of buffer memory released can be calculated. This allows visibility into the buffer fullness from 0% to 100% or in between as activities occur.

Further in this example, the activity record 144 contains performance data and specifies that something happened in the functional verification test scenario. More particularly, the activity record 144 can identify that some activity with a specific purpose (referred to herein as an "operation") identified using a operation: string data element) occurred at a specific time (identified using a timestamp_ps data element) on a specific interface (identified by the interface_name data element) and it relates to a previous interface record (e.g., 142 in this case). The previous interface record 142 is specified as a foreign key relationship, and the activity record 144 would contain the same interface name as the prior interface record 142. Using the timestamp_ps performance data, the performance data analysis tools can calculate time elapsed between two different activities. By including performance data indicating how big the activity was, for instance as identified using a payload_size: unsigned integer data element, combined with the cycle modeling protocol, clock period, and interface width for an interface from the interface record 142, the performance data analysis tools 402 can calculate how long that activity took that was identified by the operation data element.

Also illustrated as contained in the activity record 144 are data elements flit_size: unsigned integer and flit_count: unsigned integer. Here, flit refers to flow control unit, which in electronic networking is the smallest indivisible unit of a data transfer on an interface. In a particular example, the product of the flit size, flit count, and payload size indicates how many pieces made up this activity, how big each of those pieces were, and how many there were. In this example, the performance data mathematically models the behavior of the electronic device, but it isn't necessarily in a one-to-one relationship with how the electronic device works because of the protocol-agnostic nature of the performance data. For instance, a common classification for electronic interfaces is in the number of bits of data transferred concurrently over the wires of the electronic interface. Serial interfaces are characterized by transferring one bit at a time and transfer for a certain amount of time at minimum. Parallel interfaces are characterized by transferring many bits at a time. The interface record 142 and the activity record 144 can then constitute a description relative to the model, in this example, of the operation of the DuT interface corresponding to the interface record 142 and the nature of the occurrence on that DuT interface of the activity corresponding to the activity record 144. In another example, the user 160 provisioning the UVM test bench 102 may decide on a strategy for modeling the DuT 106 behavior using one or more activity records 144 such that the results of the performance calculations accurately represent the DuT 106.

The transaction record 136 and the linkage record 140 refer to prior activities. Additionally, in this example, the transaction record 136 has a unary relationship with the activity record 144. Namely, the transaction record 136 refers to one previous activity record 144 and adds some extra information to it. The linkage record 140 has a binary relationship between two activity records 144 and relates one activity indicated by an activity1 data element to a second activity indicated by an activity2 data element. By producing multiple linkage records 140, a large number of activities can be related or connected together into an aggregate. The use of transaction records 136 and linkage records 140 can enable the performance data analysis tools 402 to calculate one or more latency performance measurements.

In the illustrated example of the linkage record 140, a latency_flow_key: string data element identifies the kind of device that created a caused element (e.g., of traffic such as a response) as output after receiving a causing element (e.g., of traffic such as a request) as input. For a particular example, a response_turnaround: boolean data element is TRUE if this causal connection connects a causing request to the caused response or this connection is made outside of the DuT 106; otherwise this data element is FALSE. Additionally, a scoreboard_name: string data element indicates a name for the UVM Scoreboard feature provisioned by the instrumentation code. In the illustrated example of the transaction record 136, user operation: string and address_info data elements may indicate further metadata configured by the user 160.

Referring again to FIG. 5, in an example, using the captured performance data and any captured metadata, the performance analysis tools 402 can calculate (510) the one or more performance measurements. Results of the calculations or versions thereof such the detailed calculations or summaries can, at block 512, be presented to the user 160 via the user interface 206, stored in the performance summary database 406, and/or presented as or in an application programming interface (API) to the UVM test bench 102 or to other programs executed by the processor 200, or a website that is driven at least in part by the performance summary database 406.

In one example, the summary data is attached to all or some of the available metadata about the functional verification testing, including, but not limited to date, time, simulated duration, and name of the test. The summary data may also include user-specified information about the circumstances for running the test. In one example, for an automated run of regression tests, identifying information for that particular regression run can be recorded and provided through an API to the UVM test bench 102 to automatically initiate the next regression run. In another example, the summary data, at least in part, can be used to power a website presented to the user 160. In a particular example, code can be written in the website that manipulates the summary data, for example to compare results of multiple tests. In another example, the user 160 can specify a string indicating a group of related performance tests. Additional information that may be stored as summary data in the performance data database 400 includes a project name for a project in which the functional verification testing was run, an identifier for the functional verification testing topology used, and user-specified arbitrary metadata that the user 160 specified in the UVM test bench 102.

In another example, the summary data recorded in the performance data database 400 can include statistical summary data from one or more of the performance measurement calculated. In a particular example for utilization and bandwidth data, the summary data may be determined by the utilization and bandwidth data being divided up into multiple, e.g., ten, segments of approximately equal length, and the minimum, maximum, and mean throughput recorded for each of these segments. In another example for utilization and bandwidth data, the summary data may be determined by two representative smaller segments of the functional verification testing being selected and a length of these segments chosen based on a multiple of a window length for a moving average used to calculate the data in graphs of utilization and bandwidth.

In a particular example for latency data, every identified high-level measurement can be recorded, including the minimum, maximum, mean, median, and count of the data set, which can be further associated with a flow graph upon which the high-level measurements were made and with symbolic identifiers used in a canonical representation of the flow graph. In another example for latency data, granular latency measurements can be recorded in the performance summary database 406 and associated with the actual points where the latency measurement was made. Moreover the statistics available for granular latency measurements can be the same as for high-level latency measurements.

An example benefit of storing summary data about the calculated performance measurements is recall for comparing performance results for one functional verification testing to performance results for a different functional verification testing. For example, the user 160 may run a functional verification test once, change one or more parameters of the DuT 106 an/or the functional verification test, and run it again. For a particular example, based on summary data in the performance summary database 406, the user 160 may be presented a graph having two bars, with one bar indicating a performance measurement for the first test, and the other bar indicating a performance measurement for the second test. From this graph, the user 160 may determine the change in the performance measurement, whether performance got better or worse upon changing the parameters, etc.

Figure 7:
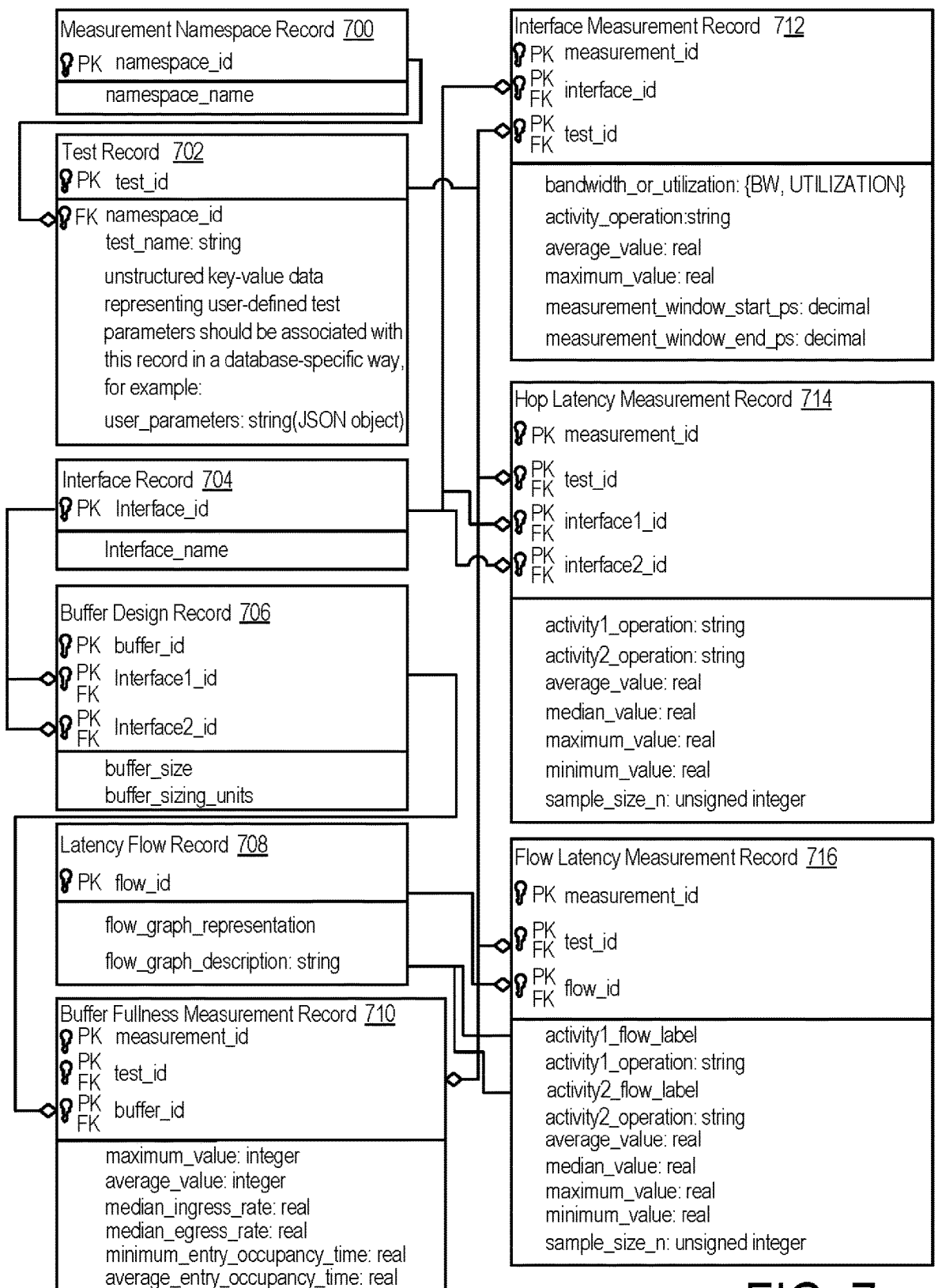
FIG. 7 depicts a performance summary database into which performance measurement summary data can be stored, according to one or more examples of the present disclosure.

FIG. 7 further illustrates the performance summary database 406 of the analysis module 124 depicted in FIG. 4, into which performance measurement summary data can be stored, according to one or more examples of the present disclosure. In particular, FIG. 7 illustrates an example arrangement and content of a measurement namespace record 700, a test record 702, an interface record 704, a buffer design record 706, a latency flow record 708, a buffer fullness measurement record 710, an interface measurement record 712, a hop latency measurement record 714, and a flow latency measurement record 716 containing data elements representing at least some of the summary data mentioned above. The data in the performance summary database 406 can represent information to keep track of a replicable measurement and to structure it in any suitable normalized database format. In the example illustrated, the performance summary database 406 has a hierarchical structure, which can be indicated by primary keys and foreign keys. The primary keys and foreign keys may connect the records in the performance summary database 406 similar to how the records are connected in the performance data database 400, as previously described.

In an example, the measurement namespace record 700 may enable performance results for different functional verification tests to be divided into namespaces in order to reuse test names, project names, and interfaces between projects without their test results being directly comparable to each other. The example measurement namespace record 700 contains a namespace_id data element to connect the measurement namespace record 700 with one or more other records in the performance summary database 406 and a namespace_name data element to identify a particular namespace.

In an example, the test record 702 can enable summary data to be presented for different functional verification tests that belong to the same namespace or project. In a particular example, the selection is based on parameters provided with respect to the test name, etc. In a particular example, the parameters are user specific parameters identified using a user_parameters: string (JSON object) data element of the test record 702. The example test record 702 also contains the namespace_id data element and a test_id data element to connect the test record 702 with one or more other records in the performance summary database 406. The example test record 702 further contains a test_name: string data element to identify a particular test or project.

The interface record 704 corresponds to the interface record from the performance data, in this example the interface record 142, and includes at least the metadata of what the interface was named, as identified by the interface_name data element. The example interface record 704 also contains the interface_id data element to connect the interface record 704 with one or more other records in the performance summary database 406.

The example buffer design record 706 contains buffer_id, Interface1_id, and Interface2_id data elements to connect the buffer design record 706 with one or more other records in the performance summary database 406. The example buffer design record 706 further contains the buffer_size and buffer_sizing_unit data elements also contained in the corresponding module record within the performance data database 400, e.g., the module record 138.

The summary records 708, 710, 712, 714, and 716 can further specify at least some of the summary data mentioned above and other summary data including, but not limited to: where the measurement was taken, e.g. by identifying at least one module within the DuT 106; upon which test was the measure performed, e.g. by identifying the name and time of execution of the test; what the numbers represent, what are the units, e.g. the unit of measurement for bandwidth measurements possibilities including gigabytes, megabytes, or terabytes per second, e.g. a utilization percentage; what operation or operations were measured on that interface, what duration of the simulation was used for performance data capture, and other suitable statistical summary data.

The example latency flow record 708 contains a flow_id data element to connect the latency flow record 708 with one or more other records in the performance summary database 406. The example latency flow record 708 further contains flow_graph_representation and flow_graph_description: string data elements that, respectively, identify data and a name for a summary graph derived from latency performance measurement calculations.

The example buffer fullness measurement record 710 contains a measurement_id, the test_id, and the buffer_id data elements to connect the buffer fullness measurement record 710 with the buffer design record 706 and with one or more other records in the performance summary database 406. The example buffer fullness measurement record 710 further contains summary buffer performance values calculated, for instance, based on or using performance data from a module record, e.g., the module record 138, from the performance data database 400.

The example interface measurement record 712 contains the measurement_id, the interface_id, and the test_id data elements to connect the interface measurement record 712 with the records 702, 704, and 710 and with one or more other records in the performance summary database 406. The example interface measurement record 712 further contains bandwidth_or_utilization: {BW, UTILIZATION}, activity_operation string, average_value: real, maximum_value: real, measurement_window_start_ps: decimal, and measurement_window_end_ps: decimal data elements that represent which performance measurements (bandwidth, utilization, or both) were calculated, for what activity, and the calculated performance measurement values.

The example hop latency measurement record 714 contains the test_id, interface1_id, and interface2_id data elements to connect the hop latency measurement record 714 with the test record 702 and with one or more other records in the performance summary database 406. The example hop latency measurement record 714 further contains activity1_operation string, activity2_operation string, average_value: real, median_value: real, maximum_value: real, minimum_value: real, and sample_size_n: unsigned integer data elements that represent calculated hop latency measurement values and metadata for the calculated hop latency measurement values.

The example flow latency measurement record 716 contains the measurement_id, the test_id, and the flow_id data elements to connect the flow latency measurement record 716 with at least the records 702, 708, and 712 in the performance summary database 406. The example flow latency measurement record 716 further contains activity1_flow_label, the activity1_operation string, activity2_flow_label, the activity2_operation string, average_value: real, median_value: real, maximum_value: real, minimum_value: real, and sample_size_n: unsigned integer data elements that represent calculated flow latency measurement values and metadata for the calculated flow latency measurement values.

Figure 8:
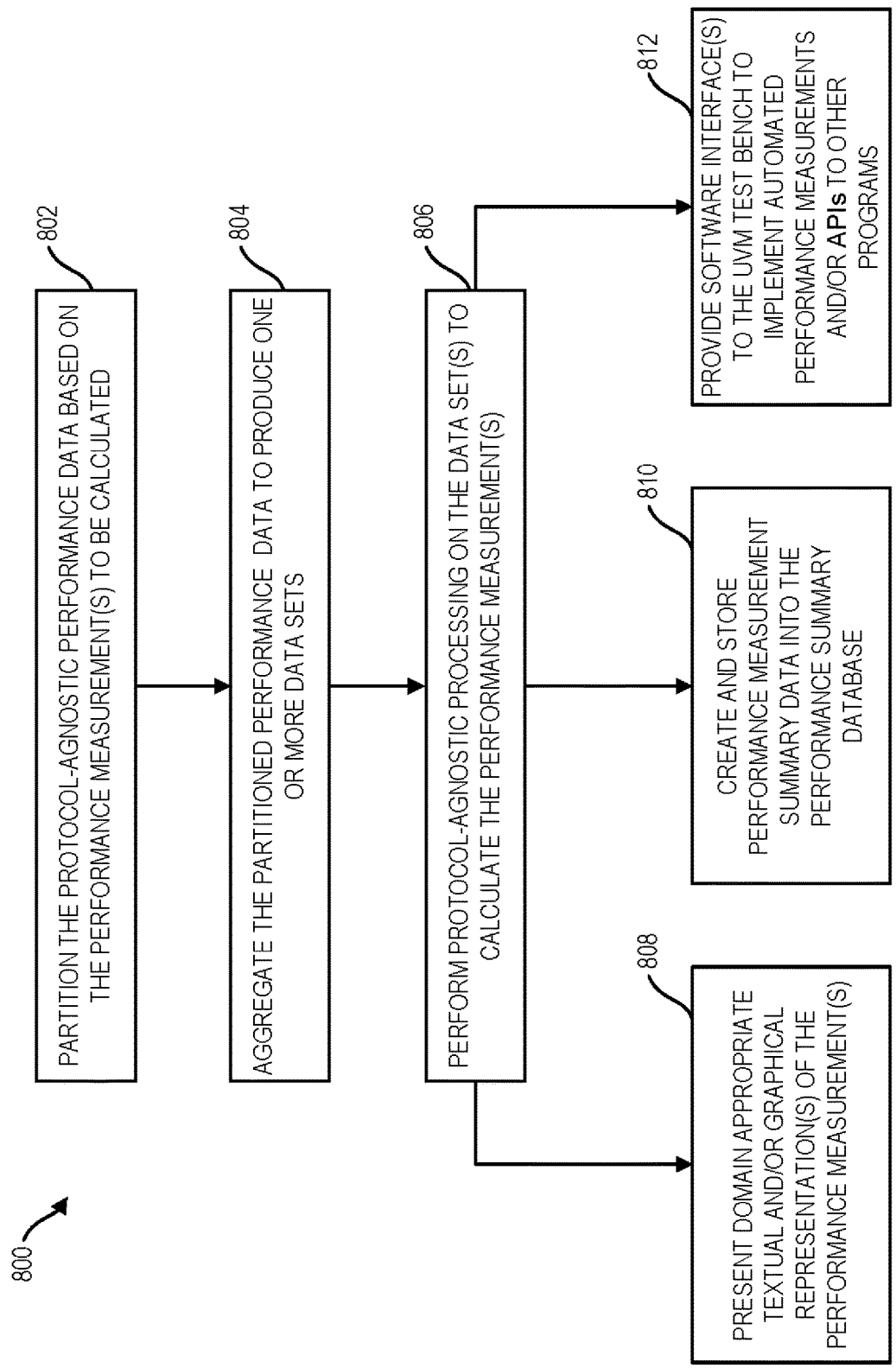
FIG. 8 depicts a method for calculating, from captured protocol-agnostic performance data, one or more performance measurements, according to one or more examples of the present disclosure.

FIG. 8 depicts a method 800 for calculating, from captured protocol-agnostic performance data, one or more performance measurements, according to one or more examples of the present disclosure. Method 800 is representative of a general algorithm that can be applied by the performance data analysis tools 402 to the performance data in the performance data database 400 to calculate performance measurements in general. The method 800 includes multiple steps where protocol-agnostic processing or criteria are used, based on various types of information included in the captured protocol-agnostic performance data. The specific manner of processing data may, in one example, be specified by a particular verification component according to the values captured using the instrumentation code, limited by the specific capabilities Example method 800 includes partitioning (802) the performance data based on the one or more performance measurements to be calculated. In one example, the protocol-agnostic performance data is partitioned into the smallest processable units that could be processed to produce the performance measurement of interest. An example minimum processing unit for bandwidth may be a single data transfer or the instantaneous bandwidth that the DuT 106 achieved while processing this activity, e.g., a number of gigabytes per second over a measured amount of time.

The partitioned data is aggregated (804) to produce one or more data sets or groups upon which protocol-agnostic processing can be performed (806) to calculate the performance measurements. Thereafter, a number of actions may be taken by the analysis module 124. For example, the analysis module 124 presents (808) one or more domain appropriate textual and/or graphical representations of the performance measurements. The graphs may be used to compare the results of performance measurements from one functional verification test against of performance measurements from another functional verification test.

One example graph is a bar chart showing relative bandwidth achieved over a link in tests where some setting was modified, where the bars are sorted by the values of the setting's value. Another example graph includes a multiple line chart showing the application memory bandwidth achieved versus the average latency of a memory read, grouped according to the workload used. Another example is a bandwidth versus bandwidth graph of an application data mover showing that the output bandwidth is a multiple of the input bandwidth, depending on the size of the data mover transaction. The graph may show the data mover approaching and reaching saturation on the output bandwidth. In a particular example, performance data is selected based on the metadata attached to each functional verification test, and the user 160 can specify criteria related to any of the available items of metadata.

The analysis module 124 may also create and store (810) performance measurement summary data into the performance summary database 406. In a particular example, the summary data can be used to generate the graphs, including one or more of the graphs mentioned above. In yet another example, the analysis module 124 provides (812) one or more software interfaces to the UVM test bench 102 and/or a website to implement automated performance measurements. For example, one or more parameters of the DuT 106 and/or the functional verification testing, such as the stimuli, can be automatically changed based on the performance measurement results. The functional verification testing may be automatically initiated to run based on the changed parameters.

Figure 9:
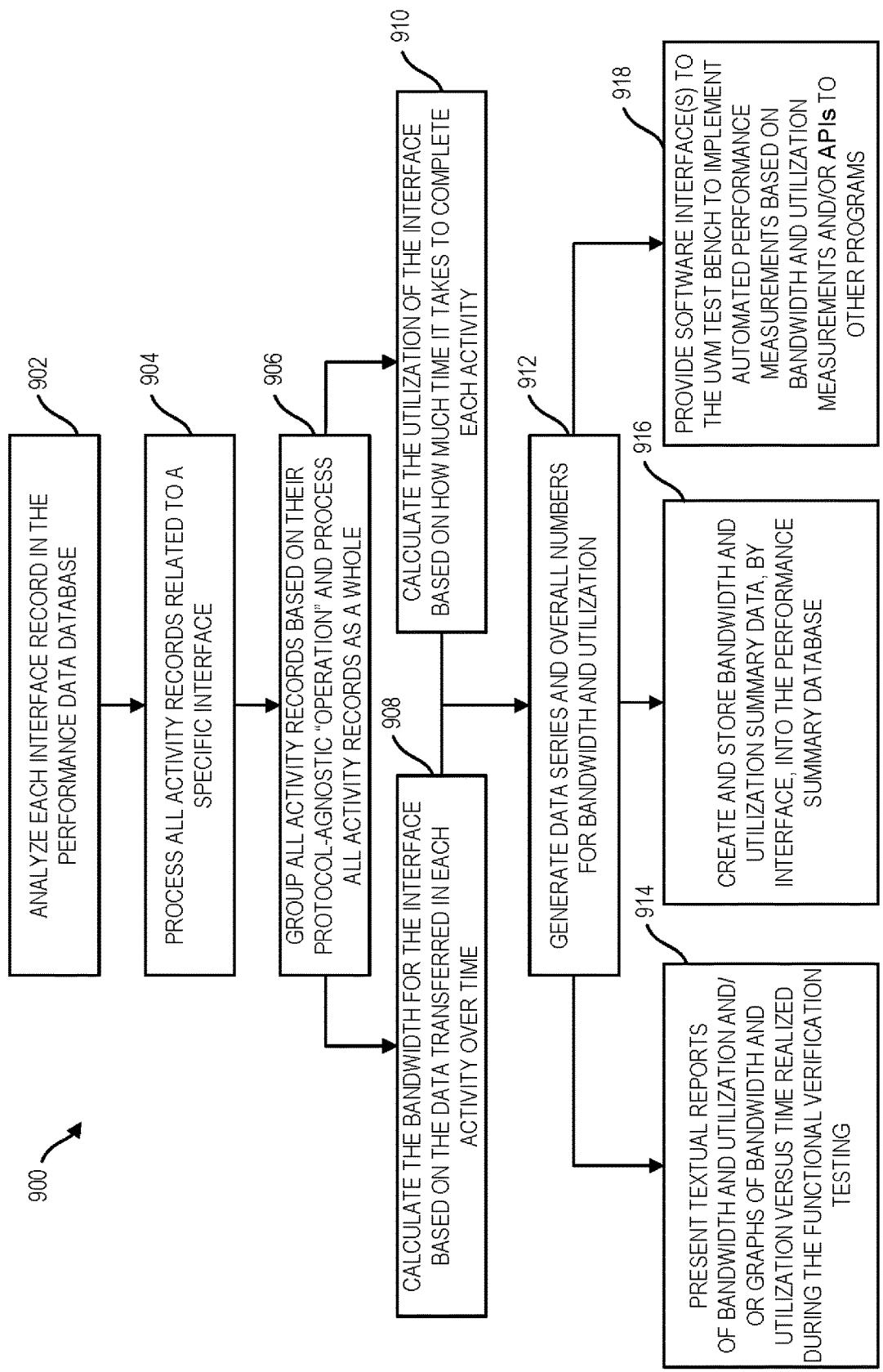
FIG. 9 depicts a method for calculating, from captured protocol-agnostic performance data, bandwidth and utilization performance measurements, according to one or more examples of the present disclosure.

FIG. 9 depicts a method 900 for calculating, from captured protocol-agnostic performance data, bandwidth and utilization performance measurements, according to one or more examples of the present disclosure. In this example, method 900 represents method 800 applied for calculating bandwidth and utilization measurements.

To partition the performance data, each interface record 142 may be analyzed (902) so that all activity records related to a specific interface can be processed (904). The activity records can then be grouped (906) based on their protocol-agnostic operation, as indicated in the activity records 144, such as a Read operation or a Write operation. Thus, multiple aggregations of the data records may be generated for the bandwidth and utilization calculations. In an example, bandwidth is calculated (908) for an interface based on the data transferred in each activity over time. In another example, utilization is calculated (910) based on how much time it takes to complete each activity. From these calculations, a data series can be generated (912) and overall bandwidth and utilization numbers calculated. Example data series and overall numbers include, but are not limited to, average bandwidth for the entire functional verification test, bandwidth achieved during each part of the test, whether bandwidth went up or down over time or was constant, etc.

In one example, an iUVC 112, 114, 116, 118 need not necessarily map one-to-one with a utilization and/or bandwidth measurement. This is because some hardware interfaces are better modeled, from a performance perspective, as more than one channel. For instance, a DDR-style interface typically has a unidirectional command bus and a bi-directional data bus. The user 160 may choose to model this type of interface can be modeled as two interfaces in the performance data, so that utilization performance calculations will be performed for the command bus and data bus separately. This choice would allow examining cases where the command bus limits performance as well as cases where the data bus limits performance based on review of the utilization performance calculation results produced from appropriate test cases. Accordingly, an iUVC 112, 114, 116, 118 can report multiple interfaces and map the activity of the hardware onto two sets of measurements.

Further to this example, a channel may represent a hardware device or a data path that has a certain number of wires available and a sampling rate, e.g., in picoseconds. In an example model for the channel, at every interval of time corresponding to the sampling rate, each wire can transfer one bit as the destination samples the output of the wire, if the channel is active. The direction of the data transfer is not assumed. An instrumented iUVC 112, 114, 116, 118 may report the memory traffic it sees and how large it is, both details used for functional verification of the device. According to the example model for the channel, the analysis module 124 may calculate on which cycles the interface is active and on which cycles the interface is transferring application data. If the reported data indicates that the iUVC 112, 114, 116, or 118 is moving more bits of overhead and data than is possible on the channel according to the model, the analysis module 124 may notify the user 160. For example, the analysis module may report to the user 160 that the data is not internally consistent.

The analysis module 124 may generate multiple outputs using or based on the calculated bandwidth and utilization measurements. In one example, textual reports are generated (914) which can be presented to the user 160. In a particular example, the textual report shows average bandwidth and/or utilization during the test, which may be logged in a place that's easy to read. In another example, graphs of bandwidth and utilization over time during the functional verification testing may be presented (914). Such graphs may be used to make the performance measurement data easy to read and visually appealing to the user 160. In another example, the analysis module 124 creates and stores (916) bandwidth and utilization summary data in the performance summary database 406. For a particular example, the performance summary database 406 provides (918) a software interface to the UVM test bench 102 and/or a website to implement automated performance measurements based on the bandwidth and utilization measurements. Storing the performance measurement data may enable comparisons to be made between different sets of performance data and/or further characterization of the performance measurement data. This may include whether the bandwidth and utilization data met a threshold value for been acceptable or that further analysis of the performance measurement data should be performed.

Figure 10A:
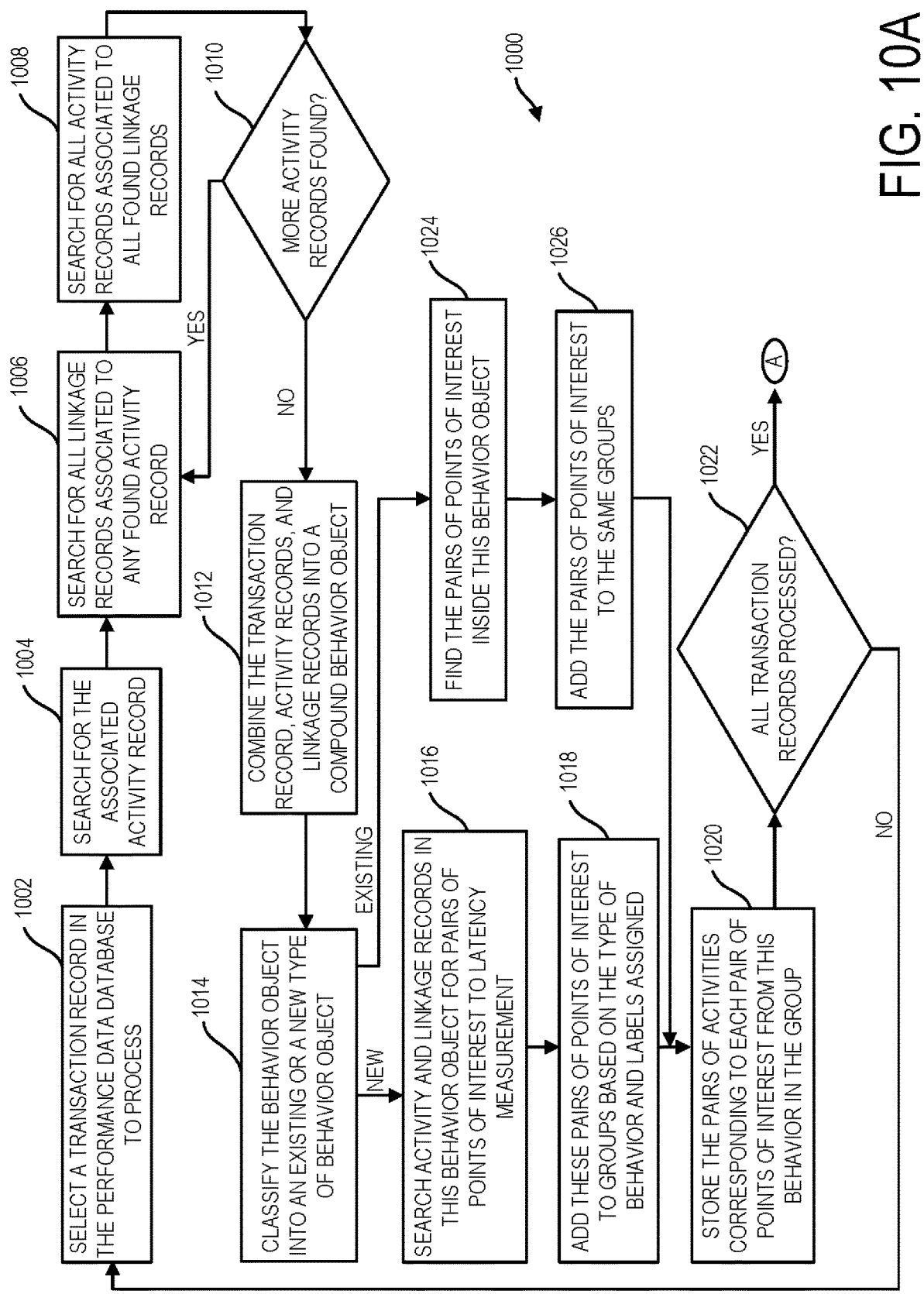
FIGS. 10A and 10B, collectively
Figure 10B:
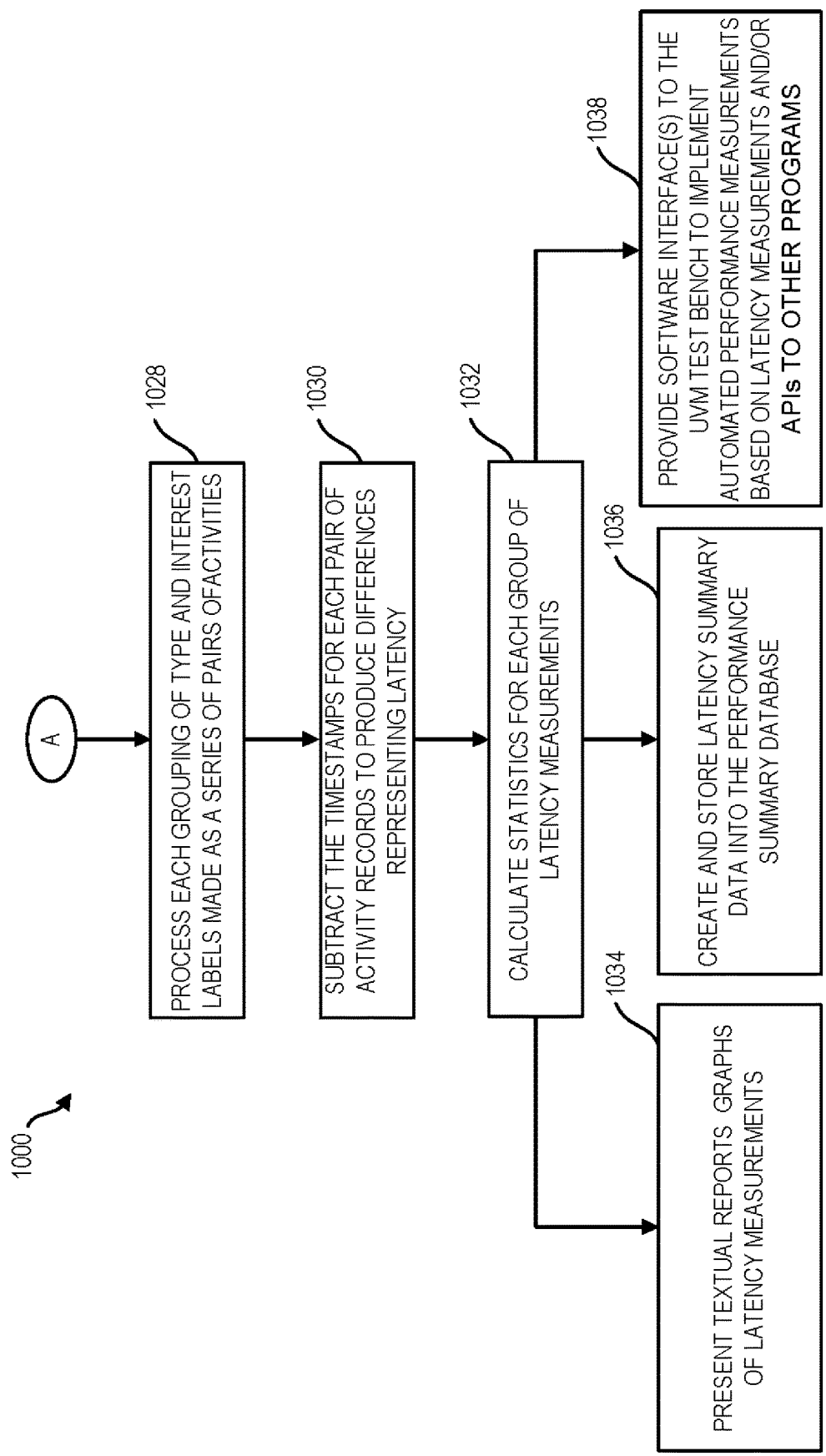

FIGS. 10A and 10B, collectively FIG. 10, depict a method 1000 for calculating, from captured protocol-agnostic performance data, latency measurements, according to one or more examples of the present disclosure. In this example, method 1000 represents method 800 applied for calculating latency measurements.

In an example, the transaction records 136 are processed as a part of calculating latency measurements. Upon selecting (1002) a transaction record 136 in the performance data database 400 to process, an associated activity record 144 is searched for (1004). Linkage records 140 for any found activity record 144 are searched for (1006), and activity records 144 associated with all found linkage records 140 are searched (1008). Then a determination (1010) is made whether more activity records 144 were found. If more activity records 144 were found, linkage records 140 for any found activity record 144 are searched for (1006), and activity records 144 associated with all found linkage records 140 are again searched (1008). Otherwise, when no additional activity records 144 are found, the transaction record 136, activity records 144 found, and linkage records 140 found are combined or grouped (1012) into a compound behavior object, which can be further processed. A compound behavior object is also referred to herein as a behavior object and a behavior.

Blocks 1002, 1004, 1006, 1008, 1012, and decision 1010 enable the performance data to be partitioned to create a compound behavior object for a given transaction, which is represented by the selected transaction record 136. In one example, ultimately a compound behavior object is created for each transaction record 136 in the database associated with the functional verification testing that was run. In a further example, the mUVC 108 and iUVCs 112, 114, 116, 118 are instrumented to provide the performance data and metadata in a manner such that each transaction record 136 corresponds with exactly one component of the functional verification test scenario referred to herein as a "behavior" of the DuT.

In other words, when latency measurements are enabled, the mUVC 108 and iUVCs 112, 114, 116, 118 in the UVM test bench 102 are instrumented to cooperate to produce performance data that describes the traffic, e.g., memory traffic, to be measured through the DuT 106. The traffic is described in a way that latency can be calculated for different pairs of points of interest during the functional verification testing regardless of the underlying protocol(s) used by the DuT 106. In one example, the points of interest correspond to high-level latency measurements that roll up total latency across high-level units of the DuT 106 behavior.

In another example, the points of interest correspond to latency across lower-level units of the behavior of the DuT 106, also referred to herein as "hop" or "granular" latency. In a particular example, any single pair of iUVCs 112, 114, 116, 118 that observe traffic elements (e.g., requests and responses) having a direct causal relationship between them via the mUVC 108 or the Responder UVC 158, where the response_turnaround flag is FALSE for the recorded relationship, can have granular latency measurements made. Each traffic element observed at the first iUVC that then directly causes something to be observed at the second iUVC results in a single latency measurement observation. This measurement may be combined with other like measurements made at the same pair of iUVCs in the same functional verification test scenario, where the type of the pair of traffic elements seen at the two iUVCs match.

In one example, the description of the traffic to enable the latency measurements has the following properties. Memory traffic is used in this example, but the teachings can be applied to any type of traffic through the DuT 106. Each element of memory traffic sent into the DuT 106 as part of the test case stimulus is marked by a transaction record 136 at the point where it is first observed by an iUVC identifying it as an element of the stimulus. As iUVCs can be both a monitoring point for DuT 106 activity and provide simulated input to the DuT 106, this is typically an easy parameter to meet when integrating the present disclosure with the UVM test bench 102. Each subsequent element of memory traffic observed within or at the edges of the DuT 106 is related, in one or more records presented to collection module 120, to a previously observed element of memory traffic which caused that element of memory traffic. An element of memory traffic can cause any number of other elements of memory traffic. The ultimate cause of every element of memory traffic observed is the single element marked as a stimulus element with a transaction record 136. Finally, an element of memory traffic may have more than one element that causes it when they all have the same ultimate cause, i.e. when those multiple elements are collectively necessary to occur, and none are individually sufficient, in order to cause the subsequent element of memory traffic, and a quorum of those collectively necessary multiple elements have the same ultimate cause.

In a particular example, a test scenario is initiated by the iUVC 112 sending request activity, e.g., the MemoryRequest1 mentioned above, to the DuT 106 through its request input interface 154 and sending a corresponding transaction to the mUVC 108, which can be reported in a transaction record. When the DuT 106 functions as expected as the MemoryRequest1 is processed during the test scenario, the MemoryRequest2 is received and reported by the iUVC 118 to the mUVC 108 as a transaction and sent to the iUVC 116. The MemoryRequest2 causes the iUVC 116 to generate a responsive MemoryResponse1 which it reports to the mUVC 108 as a transaction. Ultimately, when the DuT 106 is functioning as expected, the iUVC 114 receives and reports the MemoryResponse2 as a transaction to the mUVC 108.

The series of activities and operations through the DuT interfaces 154, 156, 152, 150 and the causation between the MemoryRequest1, the MemoryRequest2, the MemoryResponse1, and the MemoryResponse2 resulting from this traffic traveling through the iUVCs 112, 114, 116, 118 is reported in a series of records. The series of records include one or more activity records 144, linkage records 140, and a transaction record generated by the UVM test bench 102 or some verification component in the test bench, for instance iUVC 112, upon sending the MemoryRequest1 to initiate the test scenario. In an example, all the linkage records 140 and activity records 144 in that series of records connected to the initial transaction record generated as a result of the iUVC 112 sending the MemoryRequest1 to the DuT 106 can be considered a single behavior of the DuT 106. In one example, a high-level latency measurement can be calculated using the performance data from the initial transaction record 136 and connected linkage records 140 and activity records 144. In another example, lower-level hop or granular latency can be measured using the performance data from the one or more causation transaction records 136 and their respective connected linkage records 140 and activity records 144.

As relates to the example method 1000, each of these behaviors connected to a different transaction record 136 results in a corresponding compound behavior object generated at block 1012. However, to generate the latency measurements, each compound behavior object is further processed to ultimately generate pairs of activities (corresponding to pairs of activity records 144) from which latency can be calculated. Continuing the example method 1000 at block 1014, the behavior object is classified into an existing or a new type of behavior object. If the behavior object is classified as new, the activity records 144 and linkage records 140 connected to the selected transaction record 136 are searched (1016) for pairs of points of interest to calculate latency. The pairs of points or interest are added (1018) to groups based on the type of behavior and labels assigned. If the behavior object is classified as existing, the pairs of points of interest of the existing behavior object are found (1024) and added (1026) to the same groups.

Pair of activities (identified in and represented by corresponding activity records 144), which correspond to each pair of points of interest found for the new and existing behavior objects are stored (1020). A determination (1022) is made whether all the transaction records 136 have been processed. If all the transaction records 136 have not been processed, the method 1000 returns to block 1002 and again performs blocks 1002, 1004, 1006, 1008, 1012, 1016, 1018, 1020, 1024, 1026, and decisions 1010 and 1022 until it is determined that all transaction records 136 have been processed.

When all the transaction records 136 have been processed, example method 1000 continues to block 1028 for processing each grouping of type and interest labels made as a series of pairs of activities. To calculate latency measurements, the time stamps for each pair of activity records 144 (that correspond to the activity pairs) are subtracted (1030) to produce differences that represent latency. Statistics can then be calculated (1032) for each group of latency measurements (in this case each group of differences). As with the bandwidth and utilization measurements, the statistics for the latency measurements may be presented (1034) as textual reports and/or graphs, have latency summaries created therefrom and stored (1036) in the performance summary database 406, and/or provide (1038) at least one software interface to the UVM test bench 102 or a website to implement automated performance measurements based on the latency measurements.

With respect to at least the example method 1000 (and an example method 1100 described later with respect to FIG. 11), in order to aggregate DuT 106 behaviors, the behavior objects are analyzed to determine whether activities and linkages in one behavior are at least of the same shape, the same type, the same operations, the same latency flow keys, and the same response turnarounds as another behavior. This metadata can be used to determine whether two behaviors are in the same measurement class to determine latency. First, the type of the behavior object is determined (1014), e.g., new or existing. Thereafter, the behavior objects are further dissected to select datasets over which latency measurements can be more easily determined.

Based on the algorithm for classifying the behavior objects, when two behaviors are of the same type, they have the same sets of points of interest inside them which enables groupings of the pairs of points of interest. These pairs of points of interest become the datasets over which simple timestamp differences are calculated to measure latency. Additionally, in the disclosed examples, the pairings are chosen to measure the latency inside the DuT 106 to include just the portion attributed to the DuT 106 and not also the timing characteristics of the UVM test bench 102, which is under the control of the user 160.

Figure 11A:
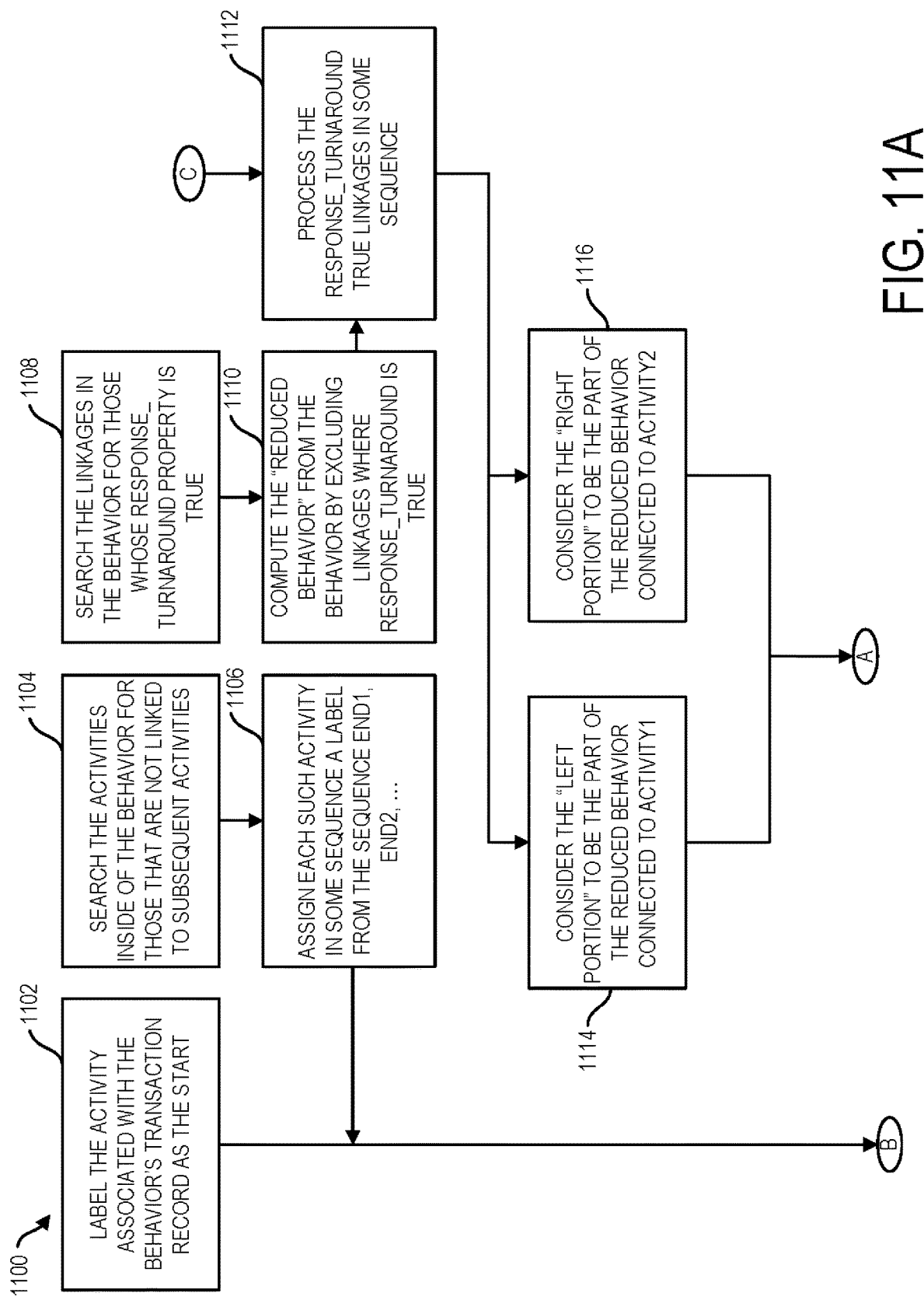
Figure 11C:
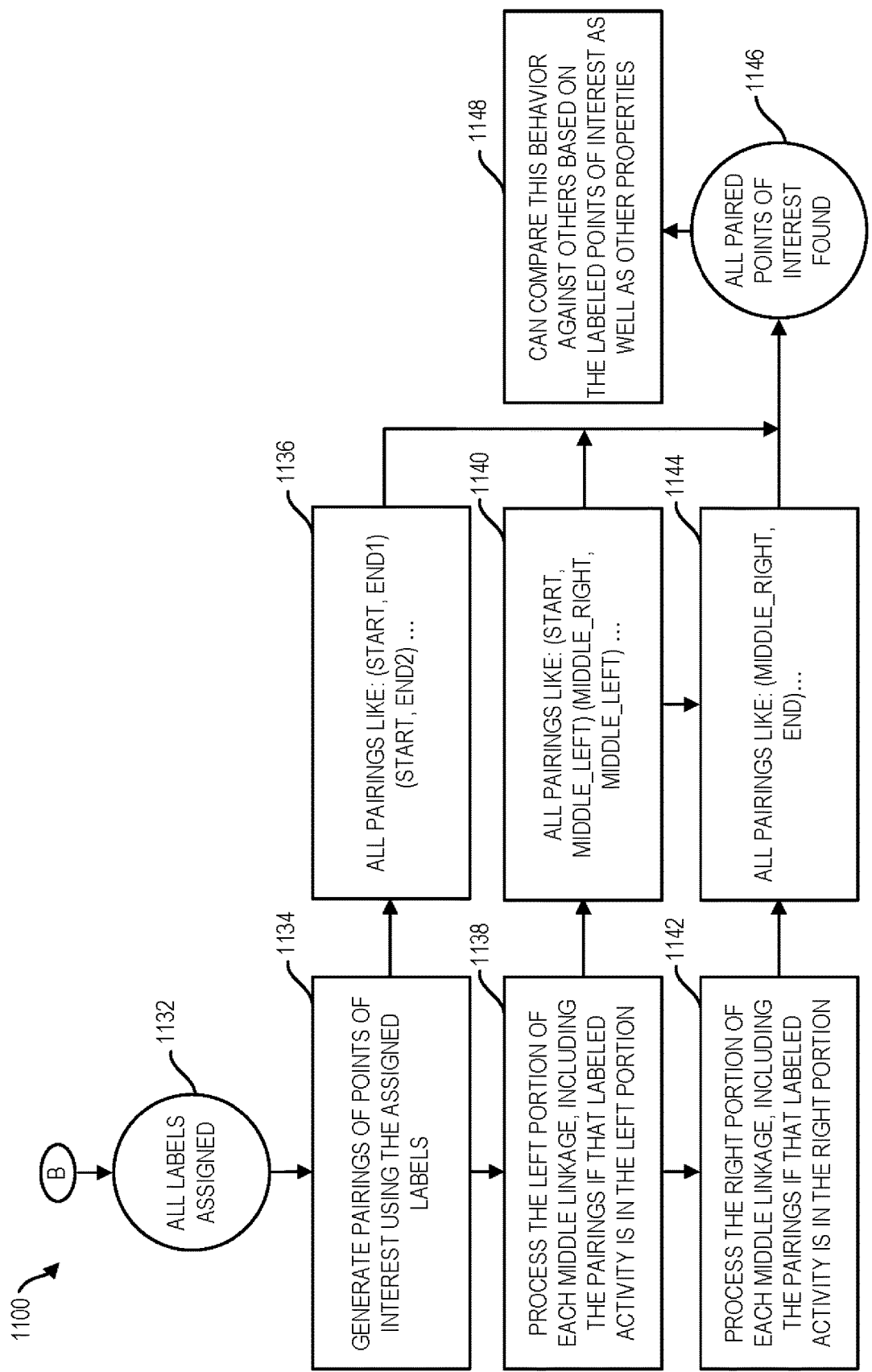

FIGS. 11A, 11B, and 11C, collectively FIG. 11, depict a method 1100 for classifying the behavior object into a new or existing type of behavior object and finding the pairs of points of interest, according to one or more examples of the present disclosure. For example, method 1100 may be used to implement blocks 1014, 1016, 1018, 1024, and 1026 of the method 1000. The example method 1100 enables a determination of whether two behavior objects (corresponding to behaviors of the DuT 106 and thereby also referred to as behaviors) are of the same type by determining whether they have the same "shape" meaning they have the same set of points of interest within them. In this example, the activities and linkages within a behavior form a graph, and finding the points of interest, looking for pairings, testing whether these portions are equivalent are applications of a graph isomorphism. The example method 1100 when met with two behaviors that are of the same type will determine they are isomorphic graphs to each other when the latency flow keys, the response turnarounds, the activities, and the operations are all the same in equivalent nodes and edges in the graph.

In accordance with the method 1100, start, end, and middle labels are assigned to the activities in the behavior. Namely, the activity associated with the behavior's transaction record is labeled (1102) as the START. This is the initiating activity. The activities inside of the behavior are then searched (1102) for those that are not linked to subsequent activities, for which there may be one or more such activities. Each such activity is assigned (1106) a label from the sequence END1, END2, . . . Blocks 1108, 1110, 1112, 1114, 1116, 1118, 1122, 1124, 1126, 1130 and decisions 1120 and 1128 are performed to determine the middle labels.

More particularly, continuing with the block 1108, the linkages in the behavior are searched for those whose response_turnaround property is TRUE (RT-TRUE). RT-TRUE indicates that the behavior has left and re-entered the DuT 106. The UVM test bench 102 has produced another response, another activity, to go back into the DuT 106, such as the iUVC 116 producing MemoryResponse1. In this example, the MemoryRequest2 activity and the MemoryResponse1 activity are connected by a linkage record for which the response_turnaround property is TRUE, because during the behavior containing the MemoryRequest2 and the MemoryResponse1, the generation of the MemoryResponse1 based on the MemoryRequest2 occurred outside of the DuT 106. In this manner, an output of the DuT 106 is linked to a subsequent input, for instance, that may be controlled by some protocol. In this example, the emulated memory device as implemented by the Responder UVC 158 produced the MemoryResponse1. A "reduced behavior" is computed (1110) for the behavior by excluding linkages where response_turnaround is TRUE. The RT-TRUE linkages are processed (1112) in a sequence to determine the middle labels. More particularly, the "left portion" is considered (1114) as part of the reduced behavior connected to activity1, and the "right portion" is considered (1116) as part of the reduced behavior connected to activity2. The left portion and right portion are checked (1118) against the same from any previously processed RT-TRUE linkage to determine (1120) whether the portions are equivalent to a previously examined pair, and thereby have the same shape as a previously examined pair. When the portions are equivalent to a previously examined pair, the linkage is assigned (1122) the same label as the previous linkage. Otherwise, the linkage is assigned (1124) a new label, in this example the next unused label in the series MIDDLE1, MIDDLE2, . . . .

Activity1 is assigned (1126) the label MIDDLE1_LEFT and activity2 is assigned (1126) the label MIDDLE1_RIGHT based on the linkage's label, which indicates (as was determined at 1120, 1122 and 1124) whether the linkage is locally the same or locally different from another linkage. The assignments in block 1126 can enable a distinction between different transactions having different numbers of data transfers. For example, the user 160 might direct the UVM test bench 102 to control the DuT 106 to perform a thousand data transfers, which produces a thousand identical data transfer activities. In this example, each one of those data transfer activities has some protocol associated with it. Example method 1100, enables each of those activities to be assigned the same label. Then when the example method 1100 pairs up these points of interest, e.g., start to middle one left, start to middle one left, middle one left, etc., the example method 1100 can distinguish between a transaction that causes a thousand data transfers, one that causes four thousand data transfers, or one that causes one data transfer, for example, because of the number and kind of pairings.

Turning now to decision 1128, which determines whether all the RT=TRUE linkages have been processed. If all RT=TRUE linkages have not been processed, the example method 1100 returns to block 1112 and continues to process the RT=TRUE linkages. Otherwise, all the middle labels have been assigned (1130), and the example method 1100 continues to block 1132 indicating that all labels (start, end, and middle) have been assigned.

Thereafter, the pairings of points of interest are generated (1134) using the assigned labels. More particularly, all pairings like (START, END1), (START, END2), etc., are generated (1136). The LEFT portion of any MIDDLE linkage is processed (1138), where pairings are included if the labeled activity is in the left portion. From this processing, all pairings like (START, MIDDLE_LEFT), (MIDDLE_RIGHT, MIDDLE_LEFT), etc., are generated (1140). The RIGHT portion of any MIDDLE linkage is processed (1142), where pairings are included if the labeled activity is in the right portion. From this processing, all pairings like (MIDDLE_RIGHT, END), etc., are generated (1144). Accordingly, all paired points of interest have been found (1146) to enable the behavior to be compared (1148) against others based on the labeled points of interest as well as other properties.

The example methods 1000 and 1100 represent an application of breadth-first search beginning at a root node. In an example, if one considers each element of traffic, e.g., memory traffic, observed by an iUVC 112, 114, 116, 118 as a node, and every causal relation reported by the mUVC 108 as an edge, this implies that each such element of traffic is a member of a rooted directed acyclic graph (a "flow graph") where the element marked as the stimulus element is the distinguished "root" node, and every other element is reachable from it. By adding the properties of latency_flow_key and response_turnaround to each edge, two additional operations can be performed on the performance data.

First, since each node and each edge of the flow graph has a label on it (e.g., the operation property of the activity representing each node, and the latency_flow_key property of the linkage representing each edge), a stricter graph isomorphism relation can be defined on this flow graph, where in the two graphs being compared, each corresponding node and each corresponding edge has a matching label to the matched node or edge. As is typical of some implementations of graph isomorphism, a graph canonicalization step can be used to enhance the speed of checking graph isomorphism. This graph isomorphism relation therefore can be made efficient to compute on large numbers of flow graph items. As a result, it is practical to identify automatically the different kinds of traffic through the DuT 106 based on whether or not they cause equivalent networks of behavior. More complicated DuT behaviors can be automatically detected by this kind of analysis. Second, the response_turnaround relation may be used to identify latency relationships to report to the user 160.

The contents of latency_pairs after running example methods 1000 and 1100 satisfies multiple properties. The root node is paired with every node that has no edges leaving it. That is, the latency from the very start is measured to the final part of the transaction (or each final part, if there is more than one final part). If we let the root node be a red node, every node which has an edge with response_turnaround=TRUE leaving it that you can reach from a red node, but without crossing such a response_turnaround=TRUE edge, is a black node for that red node. Every node that has an edge entering it with response_turnaround=TRUE is also a red node. Each red node is paired with all of its black nodes.

Example methods 1000 and 1100 retrieve symbolic labels that refer to the canonized graph instead of references to the nodes in the actual graph. A data structure that efficiently prevents inserting duplicates into latency_pairs may also be used instead of removing duplicates after the fact. Accordingly, example method 1100 may be run once per equivalence class of flow graphs in the analysis data set. Then, each flow graph in the equivalence class is queried for the pair of nodes that corresponds to each element in latency_pairs. Calculating corresponding latency measurements for multiple flow graphs in the same equivalence class can be done by converting each pair of start and end symbolic labels into a pair of actual nodes, and subtract the start time from the end time for each pair of observed memory traffic elements. Converting the symbolic labels into a pair of actual nodes is done by remembering the mapping from actual nodes to symbolic labels while canonizing the graph, and by reversing the mapping when it is time to convert symbolic to actual nodes.

Because the graph isomorphism problem here has been efficiently solved, it is also possible to associate this measurement with the equivalence class of the latency flow it was extracted from. This permits identifying whether two different functional verification test cases had the same latency flow. With this capability, it is easy to implement comparing the same latency measurement of two identical flows that occurred in two different tests by storing the measurement values as references to the canonized graph, plus a reference to a representation of the canonized graph, in a central database, for instance as a latency flow record 708 in the performance summary database 406.

Without the use of methods according to the present disclosure, identifying and performing the latency measurements to be made when a device translates from one hardware protocol to another (as in attaching a main system bus to peripherals) or when proprietary protocols are being used involves significant effort. In this case, a key performance indicator for the device is the one-way latency across the hardware implementer's components. In a particular example, a PCI Express HBA card can implement a Fibre Channel interface. Minimizing the latency from a PCI Express transaction entering the card to a Fibre Channel light pulse exiting the card is desirable. The propagation delay from registration of the PCI Express transaction to the Fibre Channel light pulse can be termed a one-way latency corresponding to the observed time delay between these events.

Methods and systems according to the present disclosure may be used to realize one or more example benefits. First, protocol-agnosticism, wherein any proprietary or emerging standard technology can be used in a performance measurement without loss of functionality. Bridges from one technology to another can have their performance validated easily and thoroughly. Additionally, integration with UVM reusability is enabled, wherein performance verification starts with functional verification, and you already have UVCs for the DuT. Additionally, integration with UVM configuration is enabled by preventing duplication of configuration between the functional and performance verification environments. For example, the test bench provisioning library 300 and performance analysis model 124 are structured to support design metadata already being reported by mUVC 108 and iUVCs 112, 114, 116, 118, e.g., leveraging the UVM Scoreboard and UVM Monitor features. Thus, using the methods and systems according to the present disclosure can be less-time consuming in describing the activity by the DuT 106 to enable the protocol-agnostic performance measurements. By contrast, other domain-specific approaches involve more effort to set up measurement instrumentation, requiring inputs describing the design, its architecture, the types of interfaces used, etc. which tends to duplicate the data available in the functional verification environment.

Moreover, high-level latency measurements are supported, wherein total latency can be measured through the DuT 106 on any one-way trip or on any round trip, as well as hop latency. With respect to latency measurements, compared with industry tools the methods and systems according to the present disclosure have additional measurement features. Many industry tools support protocols which can measure round-trip latency in a standalone fashion, for instance by using protocol-specific algorithms to identify a response corresponding to a request at two related hardware interfaces. In the previous example of the PCI Express HBA card implementing a Fibre Channel interface, a transaction implementing a read request can enter the PCI Express card, which can result in a Fibre Channel transaction that implements the data retrieval specified by the PCI Express transaction. At a certain point later, the HBA card, assuming proper operation, will sent a response that contains the retrieved data. According to certain rules of the PCI Express specification, an algorithm that identifies the response activity corresponding to the request can be written, using only information available from directly monitoring the HBA card's PCI Express interface. Such an algorithm would be specific to the use of the PCI Express standard. The problem-solving approach exemplified here is typical of many latency measurement approaches, and implements only the measurement of round-trip latency. However, that approach does not solve the measurement of one-way or hop latency. In order to solve the measurement of one-way or hop latency without the present disclosure, a traffic element being transferred between two hardware devices that use different technologies has to be transformed in a way specific to the combination of the technologies used. Accordingly, support for every combination of technologies is cost-prohibitive. As a result the protocol-agnostic approach of the present teachings, round-trip, one-way, and granular latency measurements can be calculated, at least in part, because of the use of graph algorithms for latency measurement.

For simplicity and illustrative purposes, the present disclosure is described by referring mainly to examples thereof. In the above description, numerous specific details are set forth in order to provide a thorough understanding of the present disclosure. It will be readily apparent, however, that the present disclosure may be practiced without limitation to these specific details. For instance, the examples illustrate the present disclosure being practiced where the electronic design under test represents a memory device or device in a memory subsystem. However, the present disclosure may be practiced where the electronic design under test represents another type of electronic device, for example a processing unit. Moreover, the functional verification testing and performance evaluation environment depicted in the drawings show an example number of representative elements. However, the functional verification testing and performance evaluation environment may include more or fewer elements than is depicted, and may depict a portion of a larger environment intended for functional verification testing and performance evaluation of an electronic design under test.

Additionally, some of the elements depicted may be removed and/or modified without departing from the scope of the examples described. In other instances, some methods and structures have not been described in detail so as not to unnecessarily obscure the present disclosure. As used herein, the term "includes" means includes but not limited to, and the term "including" means including but not limited to. Also, the term "has" means has but not limited to, and the term "having" means having but not limited to. Herein, the term "about" when applied to a value generally means within the tolerance range of the equipment used to produce the value, or in some examples, means plus or minus 10%, or plus or minus 5%, or plus or minus 1%, unless otherwise expressly specified.

What is claimed is:

1. A method for evaluating performance of an electronic design under test, the method comprising:
    provisioning a functional verification test bench to provide protocol-agnostic performance data for activity of the electronic design under test during functional verification testing of the electronic design under test, the functional verification test bench comprising at least one verification component that is coupled to the electronic design under test;
    capturing the protocol-agnostic performance data from the at least one verification component;
    calculating, from the protocol-agnostic performance data, at least one performance measurement for the electronic design under test;
    partitioning the protocol-agnostic performance data to identify a first plurality of activities comprising a first initiating activity and at least one linked activity wherein each activity in the first plurality of activities is causally related to another activity in the first plurality of activities;
    aggregating the partitioned protocol-agnostic performance data into one or more first data sets each data set identifying a pair of the activities of the first plurality of activities;
    performing protocol-agnostic processing on the one or more first data sets to calculate latency for each identified pair of activities of the one or more first data sets;
    applying a graph algorithm to the partitioned protocol-agnostic performance data to aggregate the partitioned protocol-agnostic performance data into the one or more first data sets each identifying a pair of the activities of the first plurality of activities;
    partitioning the protocol-agnostic performance data to identify a second plurality of activities comprising a second initiating activity and at least one linked activity, wherein each activity in the second plurality of activities is causally related to another activity in the second plurality of activities;
    applying the graph algorithm to the second plurality of activities to aggregate the partitioned data into one or more second data sets and to determine that a first graph generated by applying the graph algorithm to the first plurality of activities is isomorphic to a second graph generated by applying the graph algorithm to the second plurality of activities; and
    performing protocol-agnostic processing on the one or more second data sets to calculate latency for each identified pair of activities of the one or more second data sets.

2. The method of claim 1, wherein the protocol-agnostic performance data includes a time stamp for each activity of the first plurality of activities, the method further comprising calculating latency for each identified pair of activities by subtracting the corresponding time stamps.

3. The method of claim 1, wherein determining similarities between the one or more first data sets and the one or more second data sets comprises determining a similarity between a first identified pair of activities of the one or more first data sets and a second identified pair of activities of the one or more second data sets, the method further comprising:
    comparing the latency calculated for the first identified pair of activities with the latency calculated for the first identified pair of activities.

4. The method of claim 1, wherein the protocol-agnostic performance data comprises:
    data identifying at least one interface of the electronic design under test;
    data identifying multiple related activities of the electronic design under test occurring over the at least one interface of the electronic design under test; and
    data identifying, for each activity of the multiple related activities, a time stamp that indicates when the activity of the multiple related activities occurred over the at least one interface, for calculating a latency performance measurement.

5. The method of claim 4, further comprising:
    identifying a first activity and a second activity of the multiple related activities; and
    calculating latency between the first activity and the second activity by subtracting the time stamps identified for the first activity and the second activity of the multiple related activities.

6. The method of claim 5, wherein the protocol-agnostic performance data further comprises:
    data identifying a causal relationship between the first activity and the second activity of the multiple related activities, wherein the causal relationship identifies one or both of the first activity and the second activity as occurring over an interface that is internal to the electronic design under test.

7. The method of claim 5, wherein the protocol-agnostic performance data further comprises:

data identifying that the first activity entered the electronic design under test over a first interface and the second activity exited the electronic design under test over a second interface.

8. The method of claim 1, further comprising:
partitioning the protocol-agnostic performance data to identify activity over a first interface of the electronic design under test;
aggregating at least some of the partitioned protocol-agnostic performance data into a first data set that identifies activity for a first protocol-agnostic operation;
performing protocol-agnostic processing on the first data set to calculate one or both of bandwidth for the first interface or utilization of the first interface, wherein the bandwidth for the first interface is calculated based on data transferred over time for the activity identified by the first data set; and the utilization of the first interface is calculated based on an amount of time to complete the activity identified by the first data set.

9. The method of claim 1, wherein provisioning the functional verification test bench comprises:
provisioning a module Universal Verification Component of the functional verification test bench with instrumentation code to provide a first part of the protocol-agnostic performance data; and
provisioning an interface Universal Verification Component with the instrumentation code to provide a second part of the protocol-agnostic performance data.

10. A non-transitory computer-readable storage medium including executable instructions that, when executed by a processor, cause the processor to:
provision at least one verification component of a functional verification test bench with instrumentation code to enable the at least one verification component to provide protocol-agnostic performance data for activity of the electronic design under test during functional verification testing of the electronic design under test;
capture the protocol-agnostic performance data from the at least one verification component;
calculate a performance measurement for the electronic design under test using the protocol-agnostic performance data;
partition the protocol-agnostic performance data to identify a first plurality of activities comprising a first initiating activity and at least one linked activity, wherein each activity in the first plurality of activities is causally related to another activity in the first plurality of activities;
aggregate the partitioned protocol-agnostic performance data into one or more first data sets each data set identifying a pair of the activities of the first plurality of activities;
perform protocol-agnostic processing on the one or more first data sets to calculate latency for each identified pair of activities of the one or more first data sets;
apply a graph algorithm to the partitioned protocol-agnostic performance data to aggregate the partitioned protocol-agnostic performance data into the one or more first data sets each identifying a pair of the activities of the first plurality of activities;
partition the protocol-agnostic performance data to identify a second plurality of activities comprising a second initiating activity and at least one linked activity, wherein each activity in the second plurality of activities is causally related to another activity in the second plurality of activities;
apply the graph algorithm to the second plurality of activities to aggregate the partitioned data into one or more second data sets and to determine that a first graph generated by applying the graph algorithm to the first plurality of activities is isomorphic to a second graph generated by applying the graph algorithm to the second plurality of activities; and
perform protocol-agnostic processing on the one or more second data sets to calculate latency for each identified pair of activities of the one or more second data sets.

* * * * *